(12) United States Patent
Or-Bach et al.

(10) Patent No.: US 6,331,733 B1
(45) Date of Patent: Dec. 18, 2001

(54) SEMICONDUCTOR DEVICE

(75) Inventors: Zvi Or-Bach, Sunnyvale; Bill Douglas Cox, Palo Alto, both of CA (US)

(73) Assignee: eASIC Corporation, San Jose, CA (US)

( * ) Notice: Subject to any disclaimer, the term of this patent is extended or adjusted under 35 U.S.C. 154(b) by 0 days.

(21) Appl. No.: 09/371,031

(22) Filed: Aug. 10, 1999

(51) Int. Cl.$^7$ .......................... H01L 23/48; H01L 23/52; H01L 29/40
(52) U.S. Cl. .......................... 257/758; 257/211; 257/522
(58) Field of Search .......................... 257/758, 760, 257/522, 202, 207, 211, 210

(56) References Cited

U.S. PATENT DOCUMENTS

| | | |
|---|---|---|
| 3,473,160 | 10/1969 | Wahlstrom . |
| 4,197,555 | 4/1980 | Uehara et al. .......................... 357/70 |
| 4,706,216 | 11/1987 | Carter . |
| 4,827,325 | 5/1989 | Or-bach et al. . |
| 4,866,508 | 9/1989 | Eichelberger et al. . |
| 4,893,170 * | 1/1990 | Tokuda et al. . |
| 4,899,439 * | 2/1990 | Potter et al. . |
| 4,910,417 | 3/1990 | El Gamal et al. . |
| 4,924,287 | 5/1990 | Orbach . |
| 4,933,738 | 6/1990 | Orbach et al. . |
| 4,949,257 | 8/1990 | Orbach . |
| 4,960,729 | 10/1990 | Orbach et al. . |
| 5,027,027 | 6/1991 | Orbach et al. . |
| 5,034,799 * | 7/1991 | Tomita et al. . |
| 5,036,178 | 7/1991 | Orbach . |
| 5,049,969 | 9/1991 | Orbach et al. .......................... 357/51 |
| 5,068,063 | 11/1991 | Tremper, III . |
| 5,095,352 * | 3/1992 | Noda et al. . |
| 5,095,356 * | 3/1992 | Ando et al. . |
| 5,111,273 | 5/1992 | Orbach et al. . |
| 5,128,601 | 7/1992 | Orbach et al. . |
| 5,132,571 | 7/1992 | McCollum et al. . |
| 5,138,194 | 9/1991 | Yoeli . |
| 5,191,241 | 3/1993 | McCollum et al. . |
| 5,260,597 | 11/1993 | Orbach et al. . |
| 5,309,015 * | 5/1994 | Kuwata et al. . |
| 5,341,041 | 8/1994 | El Gamal . |
| 5,404,033 | 4/1995 | Wong et al. .......................... 257/202 |
| 5,420,544 | 5/1995 | Ishibashi . |
| 5,512,765 | 4/1996 | Gaverick . |
| 5,526,278 | 6/1996 | Powell . |
| 5,550,839 | 8/1996 | Buch et al. . |
| 5,581,098 | 12/1996 | Chang .......................... 257/211 |
| 5,684,812 | 11/1997 | Shih . |
| 5,687,325 | 11/1997 | Chang . |
| 5,723,883 * | 3/1998 | Gheewalla . |
| 5,751,165 | 5/1998 | Yoeli et al. . |
| 5,757,207 | 5/1998 | Lytle et al. . |
| 5,781,033 | 7/1998 | Galbraith et al. . |
| 5,789,807 * | 8/1998 | Correale, Jr. . |
| 5,798,559 * | 8/1998 | Bothra et al. . |
| 5,815,003 | 9/1998 | Pedersen . |
| 5,815,726 | 9/1998 | Cliff . |
| 5,825,202 | 10/1998 | Tavana et al. . |
| 5,825,203 | 10/1998 | Kusunoki et al. . |
| 5,883,525 | 3/1999 | Tavana et al. . |
| 5,898,318 | 4/1999 | Pedersen . |
| 5,959,466 | 9/1999 | McGowan . |
| 6,020,755 | 2/2000 | Andrews et al. . |
| 6,078,088 * | 6/2000 | Buynoski . |
| 6,188,095 * | 2/2001 | Hicke . |

FOREIGN PATENT DOCUMENTS

WO 98/43353    10/1998    (WO) .

* cited by examiner

*Primary Examiner*—Sheila V. Clark
(74) *Attorney, Agent, or Firm*—Venable; Jeffrey W. Gluck

(57) ABSTRACT

This invention discloses a semiconductor device including a substrate, at least first, second and third metal layers formed over the substrate, the second metal layer including a plurality of generally parallel bands extending parallel to a first axis, each band comprising a multiplicity of second metal layer strips extending perpendicular to said first axis, and at least one via connecting at least one second metal layer strip with the first metal layer underlying the second metal layer.

28 Claims, 25 Drawing Sheets

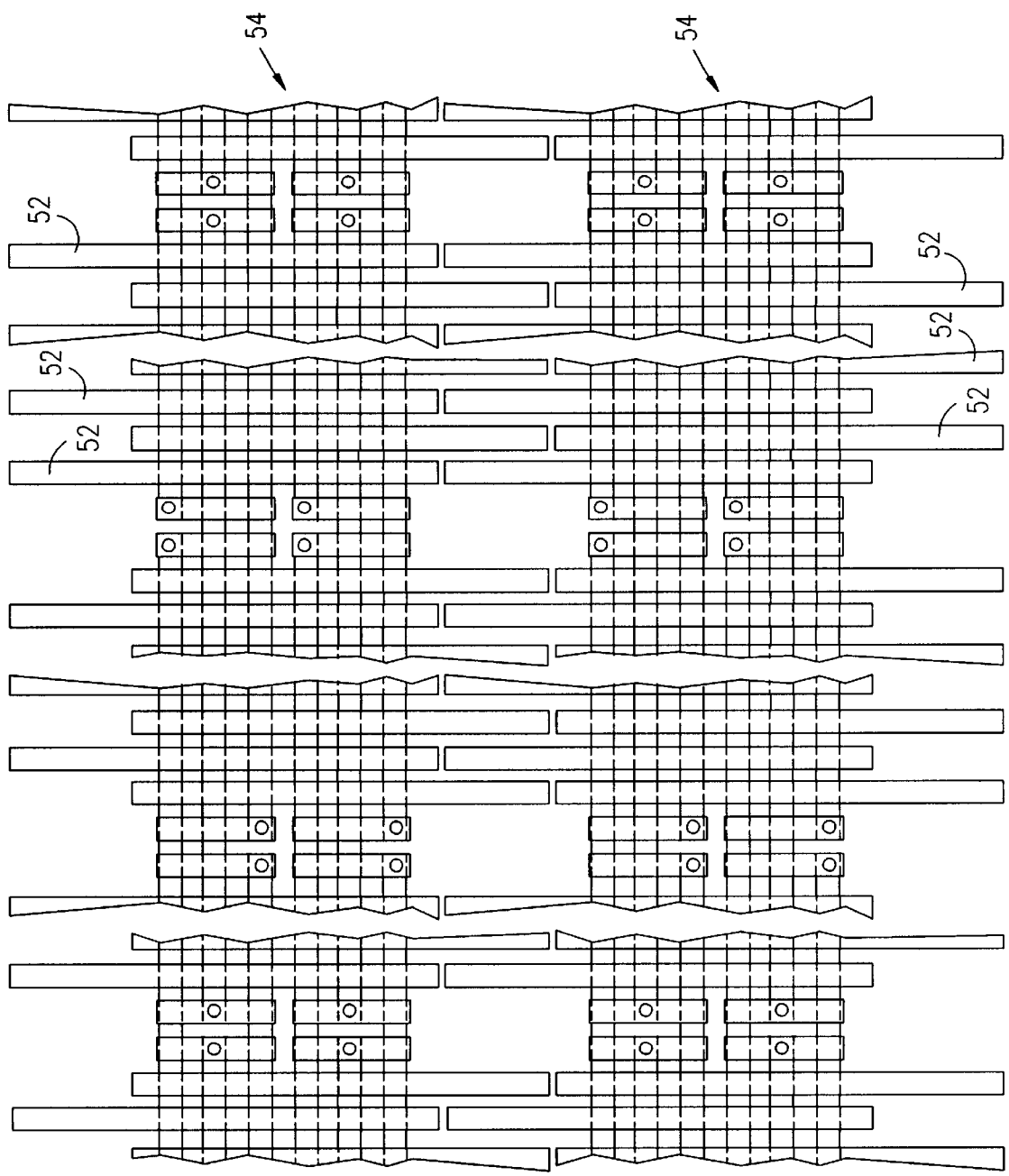
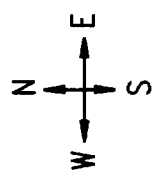
FIG. 7

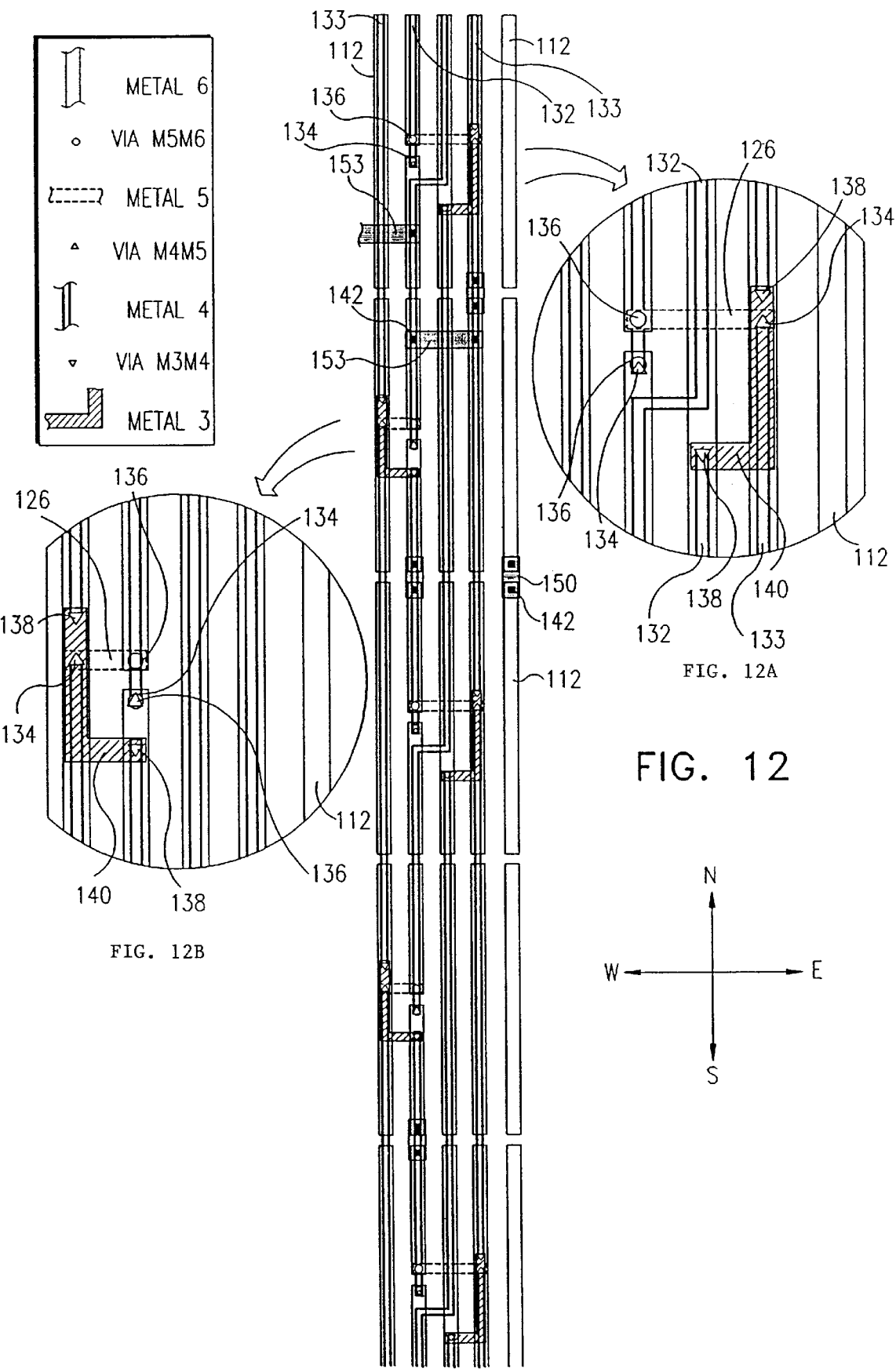

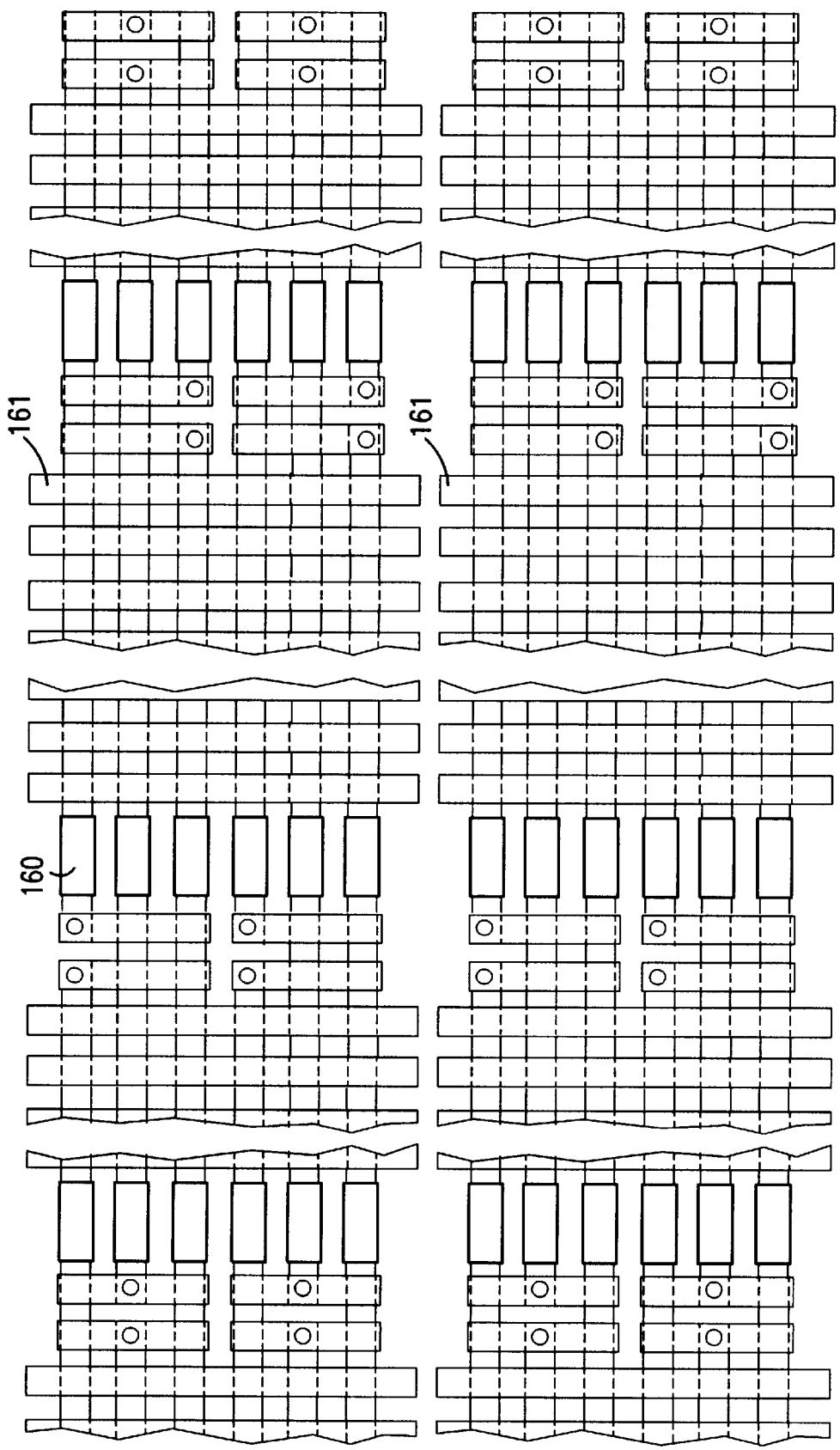

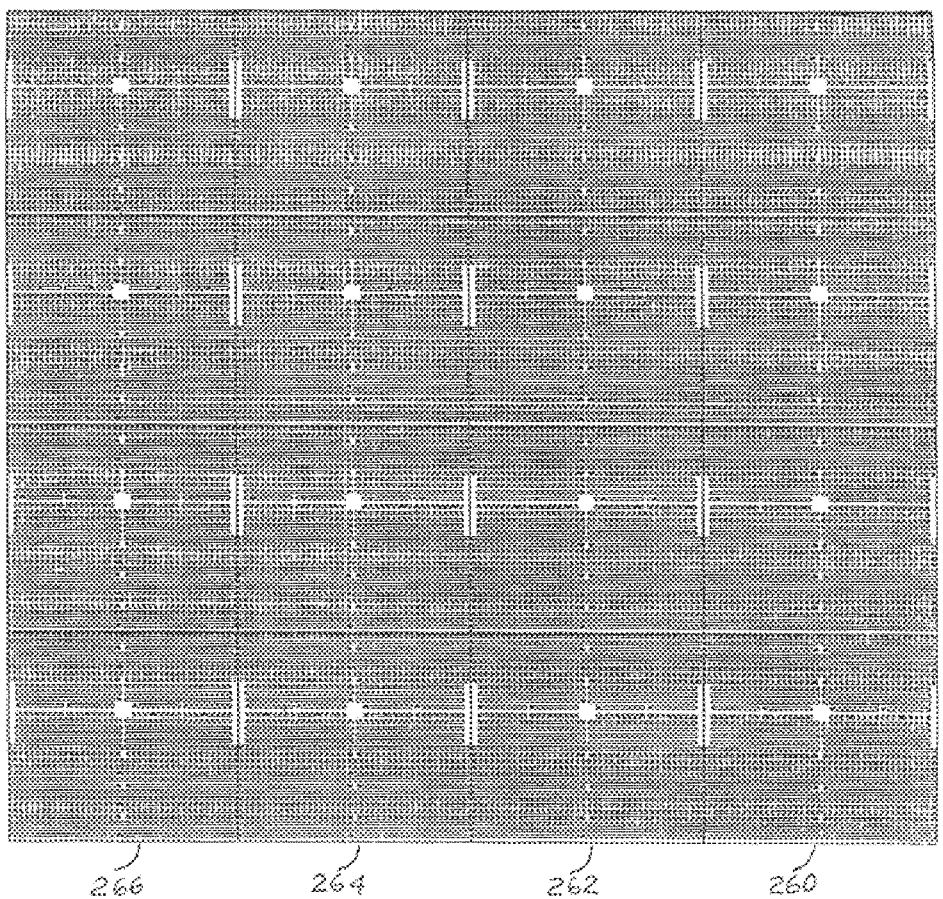
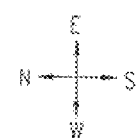
FIG. 23

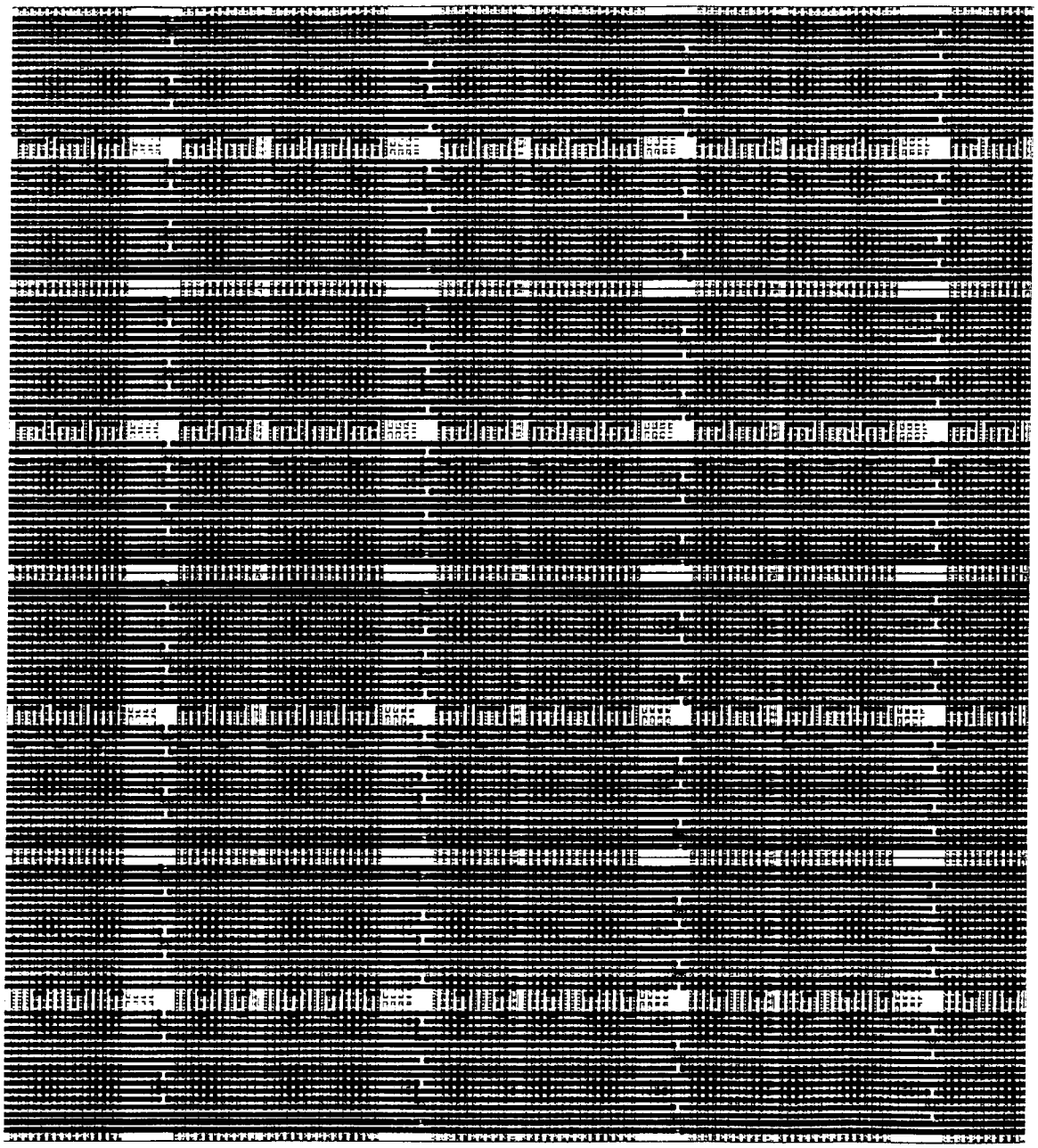
FIG. 24
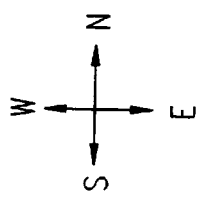

SEMICONDUCTOR DEVICE

FIELD OF THE INVENTION

The present invention relates to gate arrays generally.

BACKGROUND OF THE INVENTION

Various types of gate arrays are well known in the art. Gate arrays comprise a multiplicity of transistors which are prefabricated. A specific application is achieved by customizing interconnections between the transistors.

Routing arrangements have been proposed for reducing the number of custom masks and the time needed to manufacture gate arrays by prefabricating some of the interconnection layers in two-metal layer gate array devices. Prior art devices of this type typically employ three custom masks, one each for the first metal layer, via layer and second metal layer.

U.S. Pat. No. 4,197,555 to Uehara describes a two-metal layer gate array device wherein the first and second metal layers are pre-fabricated and the via layer is customized. Uehara also shows use of pre-fabricated first metal and via layers and customization of the second metal layer.

U.S. Pat. Nos. 4,933,738; 5,260,597 and 5,049,969 describe a gate array which is customized by forming links in one or two prefabricated metal layers of a two-metal layer device.

U.S. Pat. No. 5,404,033 shows customization of a second metal layer of a two-metal layer device.

U.S. Pat. No. 5,581,098 describes a gate array routing structure for a two-metal layer device wherein only the via layer and the second metal layer is customized by the use of a mask.

SUMMARY OF THE INVENTION

The present invention seeks to provide a multiple layer interconnection structure for a gate array device which has significant advantages over prior art structures.

The present invention employs at least three metal interconnection layers. Customization is preferably realized by customization of a via layer and a layer overlying that via layer.

There is thus provided in accordance with a preferred embodiment of the present invention a semiconductor device including a substrate, at least first, second and third metal layers formed over the substrate, the second metal layer including a plurality of generally parallel bands extending parallel to a first axis, each band including a multiplicity of second metal layer strips extending perpendicular to the first axis, and at least one via connecting at least one second metal layer strip with the first metal layer underlying the second metal layer.

Preferably the at least one via includes a repeating pattern of vias.

Further in accordance with a preferred embodiment of the present invention the third metal layer includes at least one third metal layer strip extending generally perpendicular to the second metal layer strips and being connected thereto by a via.

Still further in accordance with a preferred embodiment of the present invention the third metal layer includes at least one third metal layer strip extending generally parallel to the second metal layer strips and connecting two coaxial second metal layer strips by vias.

Additionally in accordance with a preferred embodiment of the present invention the first metal layer underlying the second metal layer includes a multiplicity of first metal layer strips extending generally parallel to the multiplicity of second metal layer strips. Furthermore, at least one of the first metal layer strips is electrically connected at ends thereof to different second metal layer strips for providing electrical connection therebetween.

Further in accordance with a preferred embodiment of the present invention the second metal layer strips include both relatively long strips and relatively short strips, at least one of the relatively short strips being connected to the first metal layer by a via. Preferably the relatively short second metal layer strips are arranged in side by side arrangement. Alternatively the relatively short second metal layer strips are arranged in spaced coaxial arrangement.

Additionally or alternatively the third metal layer includes a bridge connecting adjacent pairs of said relatively short second metal layer strips.

Still further in accordance with a preferred embodiment of the present invention the third metal layer includes at least one third metal layer strip extending perpendicular to the second metal layer strips and being connected thereto by a via. Furthermore, the third metal layer includes at least one third metal layer strip extending parallel to said second metal layer strips and connecting two coaxial second metal layer strips by vias.

Additionally in accordance with a preferred embodiment of the present invention the first metal layer comprises at least one first metal layer strip extending generally perpendicular to the second metal layer strips and being connected thereto by a via. Preferably the third metal layer includes at least one third metal layer strip extending perpendicular to the second metal layer strips and being connected thereto by a via.

Moreover in accordance with a preferred embodiment of the present invention the first metal layer includes first metal layer strips extending generally perpendicular to the second metal layer strips, the first metal layer strips being electrically connected at ends thereof by said vias to the second relatively short metal layer strips.

Still further in accordance with a preferred embodiment of the present invention the third metal layer comprises at least one third metal layer strip extending parallel to the second metal layer strips and connecting two coaxial second metal layer strips by vias.

Additionally in accordance with a preferred embodiment of the present invention also including at least one third metal layer strip extending parallel to the second metal layer strip and connecting two coaxial second metal layer strips.

There is also provided in accordance with a preferred embodiment of the present invention a semiconductor device including a substrate, at least first, second and third metal layers formed over the substrate, the second metal layer including a multiplicity of second metal layer strips extending perpendicular to the first axis, adjacent ones of the second metal layer strips having ends which do not lie in a single line.

Further in accordance with a preferred embodiment of the present invention the second metal layer strips are interlaced with one another.

Still further in accordance with a preferred embodiment of the present invention the third metal layer includes at least one third metal layer strip extending generally perpendicular to the second metal layer strip and being connected thereto by a via.

Additionally in accordance with a preferred embodiment of the present invention the third metal layer includes at least one third metal layer strip extending generally parallel to said second metal layer strips and connecting two coaxial second metal layer strips by vias.

There is provided in accordance with yet another preferred embodiment of the present invention a semiconductor device including a substrate, at least first, second and third metal layers formed over the substrate, the second metal layer including a plurality of generally parallel bands extending parallel to a first axis, each band comprising a multiplicity of second metal layer strips extending perpendicular to the first axis, and a plurality of mutually parallel relatively short second metal layer strips extending generally parallel to the first axis.

Further in accordance with a preferred embodiment of the present invention the third metal layer includes at least one third metal layer strip extending generally perpendicular to the second metal layer strips and being connected thereto by a via. Preferably at least one of the third metal strips connects two second metal layer strips by means of vias.

Still further in accordance with a preferred embodiment of the present invention the third metal layer includes at least one third metal layer strip extending generally parallel to the second metal layer strips and connecting two coaxial second metal layer strips by vias. Preferably at least one of the third metal strips connects two second metal layer strips by means of vias.

Additionally in accordance with a preferred embodiment of the present invention including at least one via connecting at least one second metal layer strip with the first metal layer underlying the second metal layer.

There is provided in accordance with yet another preferred embodiment of the present invention a semiconductor device including a substrate, at least first, second, third and fourth metal layers formed over the substrate, the second metal layer including a plurality of generally parallel bands extending parallel to a first axis, each band comprising a multiplicity of long strips extending parallel to the first axis, the long strips including at least one of straight strips and stepped strips, at least one electrical connection between at least one strip in the second metal layer to the third metal layer, which overlies the second metal layer.

Preferably the second metal layer comprises a repeating pattern.

Further in accordance with a preferred embodiment of the present invention the strips of the second metal layer are connected to one of the third metal layer and the fourth metal layer, both of which overlie the second metal layer, by least two electrical connections.

Alternatively most of the strips of the second metal layer are connected to one of the third metal layer and the fourth metal layer, both of which overlie the second metal layer, by least two electrical connections.

Further in accordance with a preferred embodiment of the present invention at least one of the strips of the second metal layer is electrically connected to another one of the strips of the second metal layer which is non-adjacent thereto.

Preferably the device forms part of a larger semiconductor device.

Still further in accordance with a preferred embodiment of the present invention the first metal layer includes a plurality of generally parallel bands extending parallel to a first axis, each band comprising a multiplicity of long strips extending parallel to the first axis, the long strips including at least one of straight strips and stepped strips, and at least one electrical connection between at least one strip in the first metal layer to the third metal layer, which overlies the first metal layer.

Additionally in accordance with a preferred embodiment of the present invention the first metal layer includes repeating pattern.

Further in accordance with a preferred embodiment of the present invention the strips of the first metal layer are connected to one of the third metal layer and the fourth metal layer, both of which overlie the first metal layer, by least two electrical connections.

Alternatively most of the strips of the first metal layer are connected to one of the third metal layer and the fourth metal layer, both of which overlie the first metal layer, by least two electrical connections.

Further in accordance with a preferred embodiment of the present invention at least one of the strips of the first metal layer is electrically connected to another one of the strips of the first metal layer which is non-adjacent thereto.

Additionally in accordance with a preferred embodiment of the present invention the semiconductor device forms part of a larger semiconductor device.

BRIEF DESCRIPTION OF THE DRAWINGS

The present invention will be understood and appreciated more fully from the following detailed description, taken in conjunction with the drawings in which:

FIG. 7 is a schematic illustration corresponding to FIGS. 1 & 3 but showing a variation in the arrangement of the middle of the three metal layers;

FIGS. 9 and 9A schematically illustrate the lower four of the top five metal layers of a gate array device constructed and operative in accordance with another preferred embodiment of the present invention, prior to customization;

FIGS. 10 and 10A show a schematic illustration corresponding to FIGS. 9 and 9A following customization thereof in accordance with a preferred embodiment of the present invention;

FIGS. 12, 12A, and 12B show a schematic illustration corresponding to FIGS. 11, 11A, and 11B following customization thereof in accordance with a preferred embodiment of the present invention;

FIG. 13 is a schematic illustration corresponding to FIG. 1 with additional bridges in the middle of the top three metal layers;

FIG. 23 illustrates an M6 layer and M5M6 via layer of a 4×4 cell matrix, in accordance with a preferred embodiment of the present invention;

FIG. 24 illustrates the layers M3, M4, M5, M6 and M7 in a 4×4 cell matrix, in accordance with a preferred embodiment of the invention.

DETAILED DESCRIPTION OF PREFERRED EMBODIMENTS

The present invention is now described with reference to FIGS. 1–15, it being appreciated that the figures, illustrate parts of pre-customized circuits which parts are repeated multiple times in an actual circuit. The precustomized circuits may or may not form a part of a larger integrated circuit device. For reasons of practicality, an entire semiconductor device including such circuits cannot be illustrated to a resolution which enables the routing structure thereof to be discerned.

Figure 1:
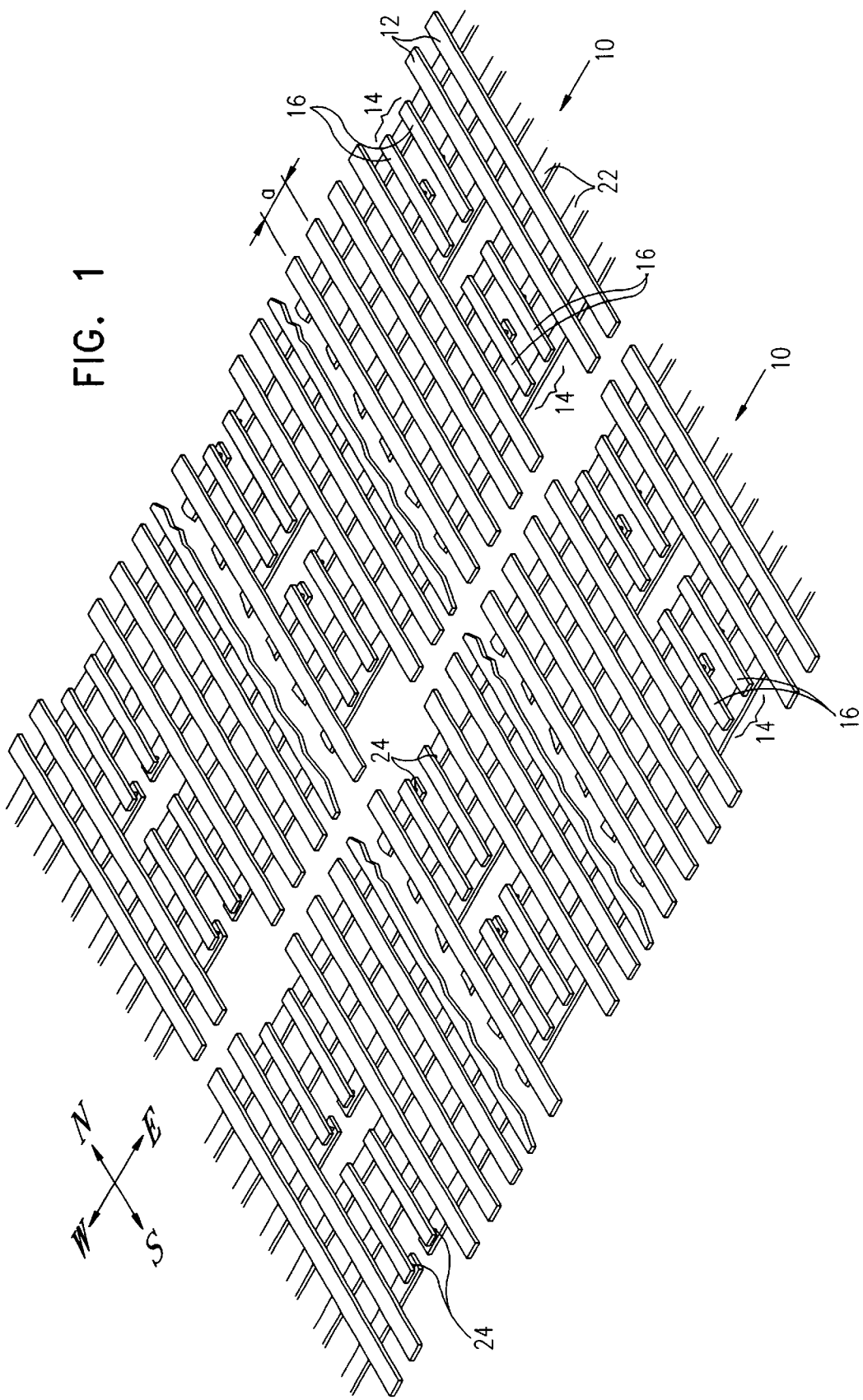
FIG. 1 is a pictorial illustration of the lower two of the top three metal layers of a gate array device constructed and operative in accordance with a preferred embodiment of the present invention, prior to customization.
Figure 3:
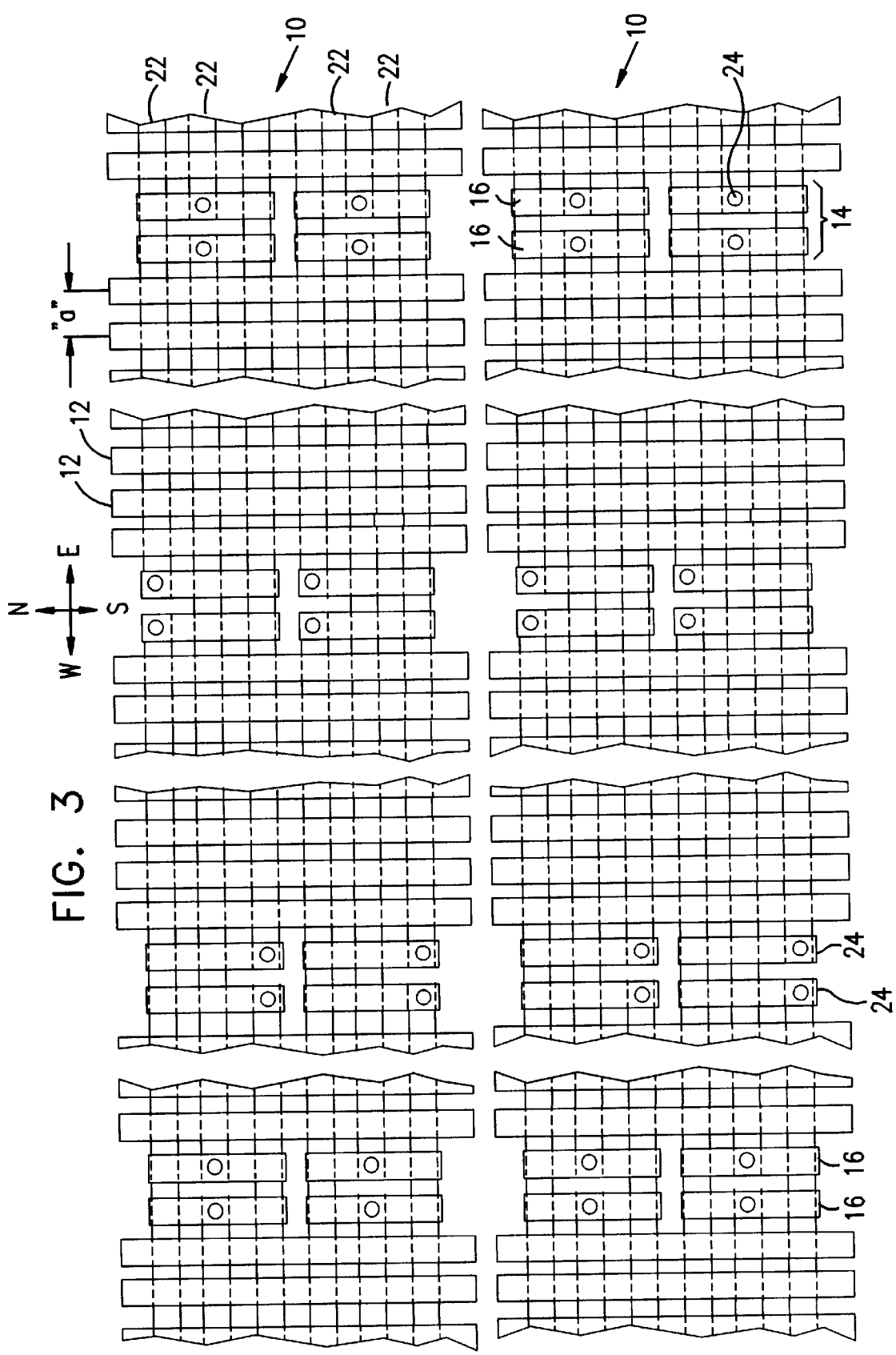
FIG. 3 is a schematic illustration corresponding to FIG. 1.

Reference is now made to FIG. 1, which is a pictorial illustration of the lower two of the top three metal layers of a gate array device constructed and operative in accordance with a preferred embodiment of the present invention, prior to customization and to FIG. 3 which is a schematic illustration corresponding thereto.

Figure 25:
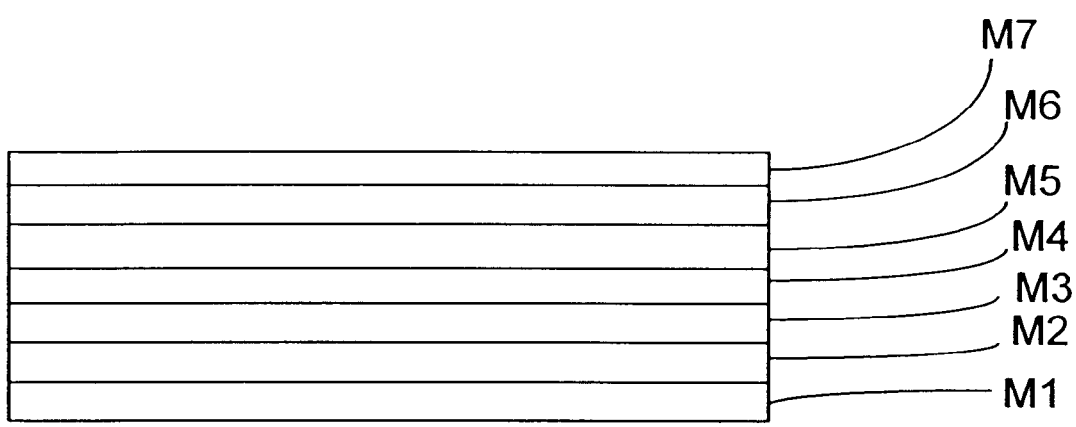
FIG. 25 illustrates seven metal layers, M1–M7, in accordance with a preferred embodiment of the invention.

In accordance with a preferred embodiment of the invention, the gate array device of FIG. 1, when customized, includes a total of seven metal layers, identified as M1–M7. Metal layers M1–M7 are depicted in FIG. 25, where M1 is the bottom metal layer and M7 is the top metal layer (vias between the layers are not shown). Metal layers M1–M3 are employed for constructing logic units or cells. Layers M4–M7 are employed for routing signals between cells. Generally, metal layers M6 and M7 are employed for relatively short or local routing paths, while metal layers M4 and M5 are employed for long or global routing. Typically, metal layers M4 and M6 provide routing generally in North-South directions, while metal layers M5 and M7 provide routing generally in East-West directions.

The present invention described herein with reference to FIGS. 1–15 shows various arrangements which provide such routing and in which metal layers M1–M6 are fixed. Customization is carried out only on vias connecting metal layers M6 and M7, here termed M6M7 vias, or on both M6M7 vias and on metal layer M7.

In FIG. 1, the top metal layer M7 is not shown, inasmuch as this metal layer is added during customization, as will be described hereinbelow with reference to FIG. 2 and to FIG. 4, which is a schematic illustration corresponding thereto.

The basic structure shown in FIG. 1 comprises an M6 metal layer which comprises multiple spaced bands 10 of parallel evenly spaced metal strips 12, the center lines of which are preferably separated one from the other by a distance "a". At a given periodicity, typically every twenty strips 12, a plurality of pairs 14 of short strips 16 is provided. The number of pairs 14 of short strips 16 and their length is a matter of design choice. Strips 12 and 16 are shown running North-South.

Underlying the M6 metal layer is an M5 metal layer comprising parallel evenly spaced metal strips 22 extending East-West in the sense of FIG. 1 in bands 10. In the illustrated embodiment of FIG. 1, strips 22 each underlie three pairs 14 of short strips 16 and are each connected at opposite ends thereof by means of an M5M6 via 24 to a strip 16. It is noted that adjacent ones of strips 22 begin and end at strips 16 of different pairs 14, such that each pair 14 of strips 16 is connected to strips 22 extending along a different axis. It is appreciated that each strip 16 preferably is connected to only a single strip 22.

It is appreciated that the embodiment of FIG. 1 is merely exemplary in that, for example, each strip 16 may overlie more than three strips 22 and thus each strip 22 may underlie more than three pairs 14 of short strips 16.

Figure 2:
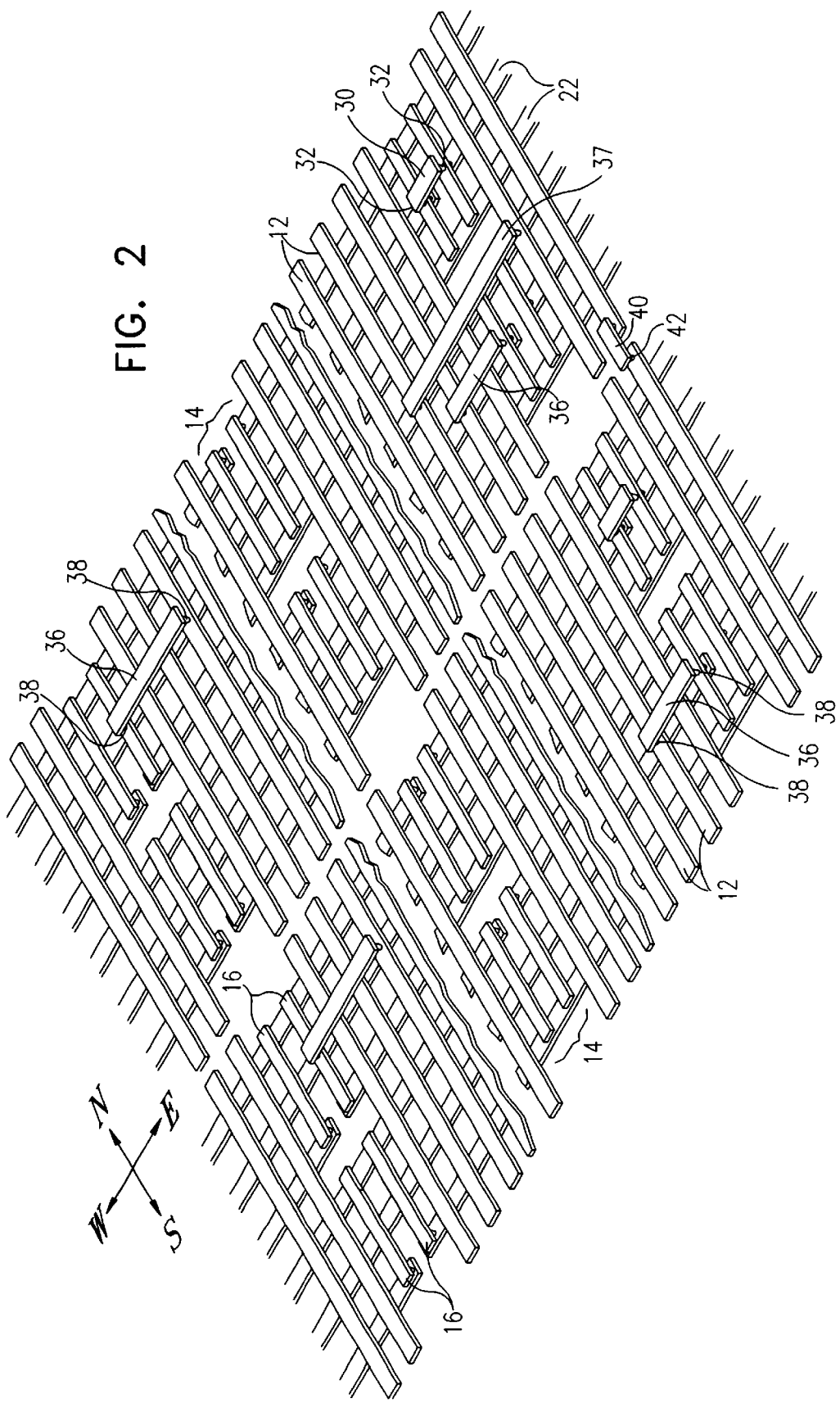
FIG. 2 is a pictorial illustration corresponding to FIG. 1 following customization thereof in accordance with a preferred embodiment of the present invention.

Reference is now made to FIG. 2, which is a pictorial illustration corresponding to FIG. 1 following customization thereof. It is seen that in FIG. 2 an M7 layer is added for customization of the gate array. The M7 layer may include a bridge 30 connected by M6M7 vias 32 to adjacent strips 16 of a pair 14, thus effectively connecting two strips 22 lying along the same elongate axis.

The M7 layer may also provide another type of connection, such as connections 36 between one of strips 16 and a strip 12, by means of M6M7 vias 38. This type of connection provides a circuit connection between a strip 22 and a strip 12.

The M7 layer may additionally provide a further type of connection, such as connections 40 between strips 12 in two adjacent bands 10, by means of M6M7 vias 42. This type of connection provides a North-South circuit connection by means of strips 12.

Figure 4:
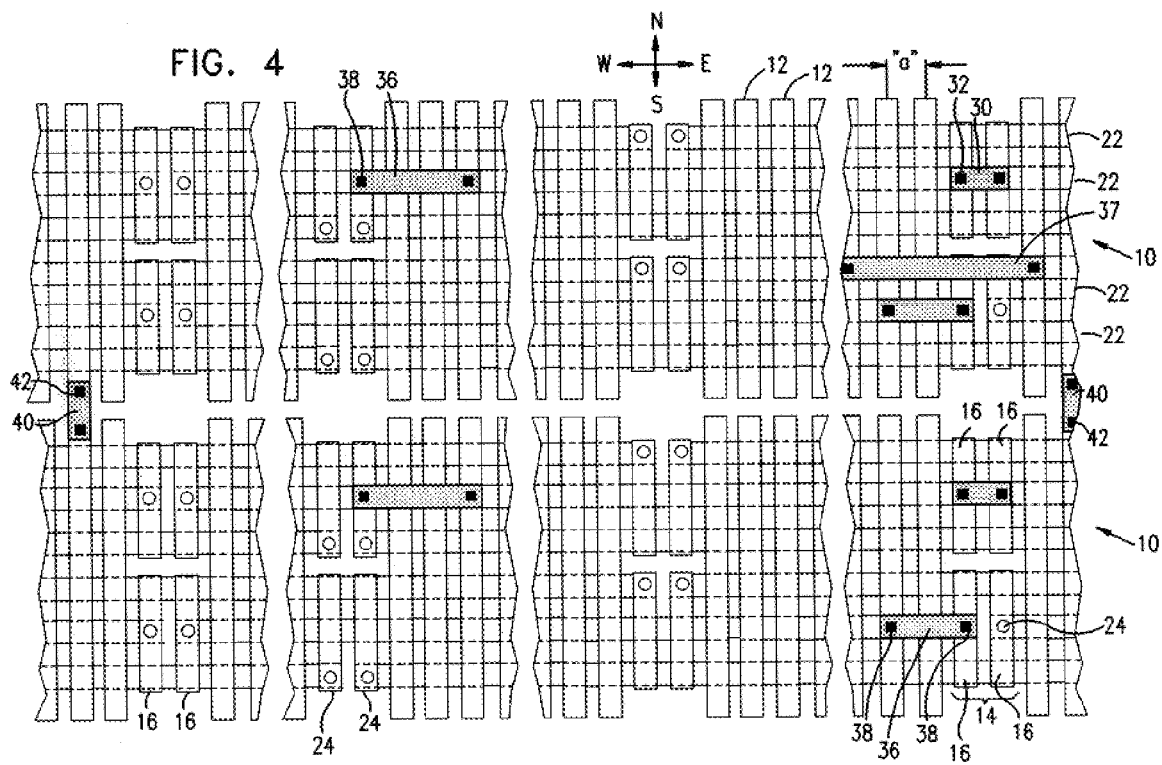
FIG. 4 is a schematic illustration corresponding to FIG. 2.

It is appreciated that the customized structure of FIGS. 2 & 4 enables a signal received along a strip 22 to be conveyed in an East-West direction via strips 22 and to be coupled to a strip 12 at an appropriate East-West location. In accordance with a preferred embodiment of the present invention, in the customization of the structure of FIGS. 1 & 3, in each band 10, a single elongate axis is employed for placement of bridges 30 for interconnecting underlying strips 22 to provide East-West routing and for placement of connections 36 between strip 12 and strip 22 for long routing of signals in East-West directions. The other parallel East-West elongate axes are employed for shorter East-West routing.

Figure 5:
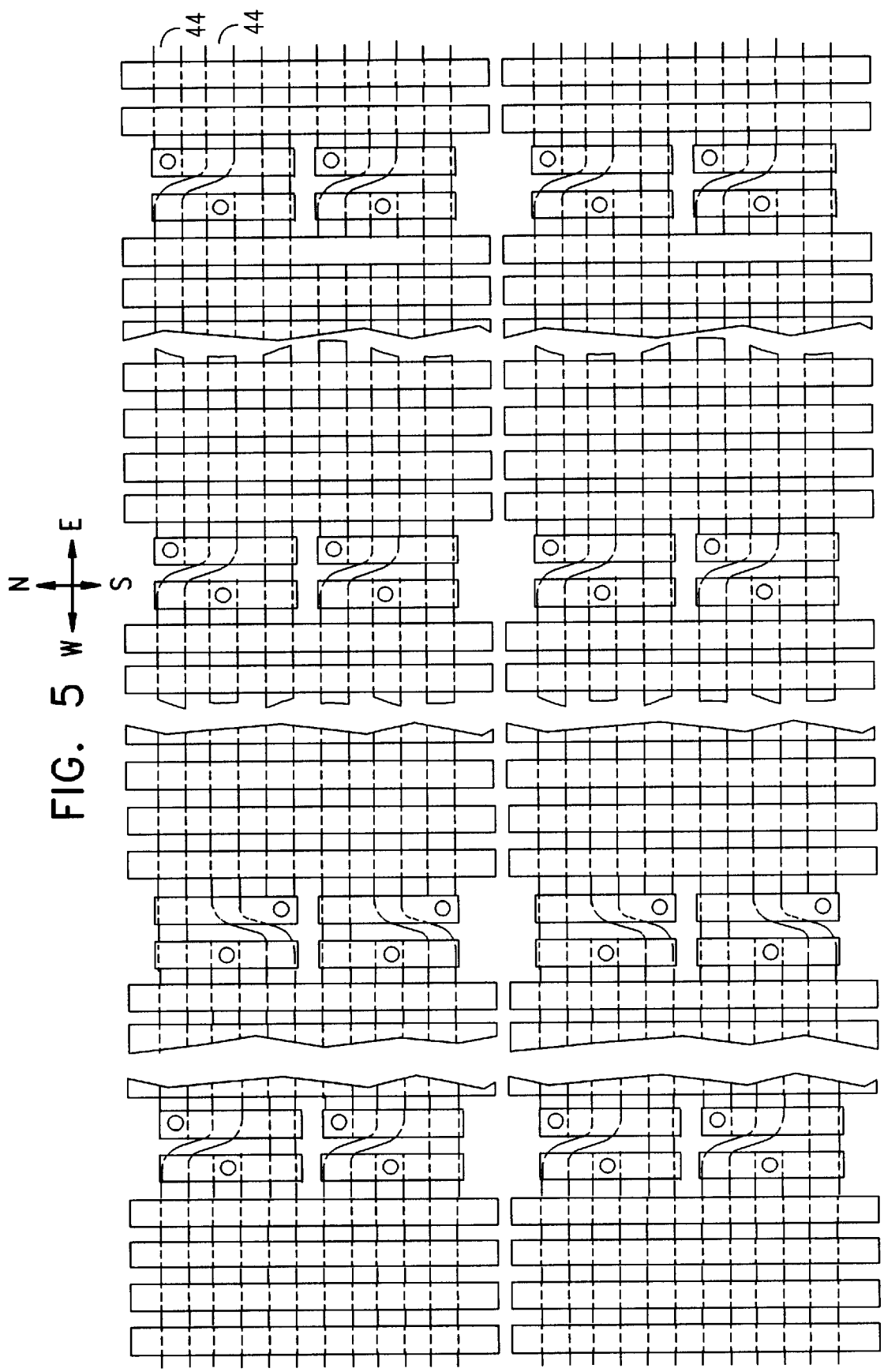
FIG. 5 is a schematic illustration corresponding to FIGS. 1 & 3 but showing a variation in the arrangement of the lowest of the three metal layers.
Figure 6:
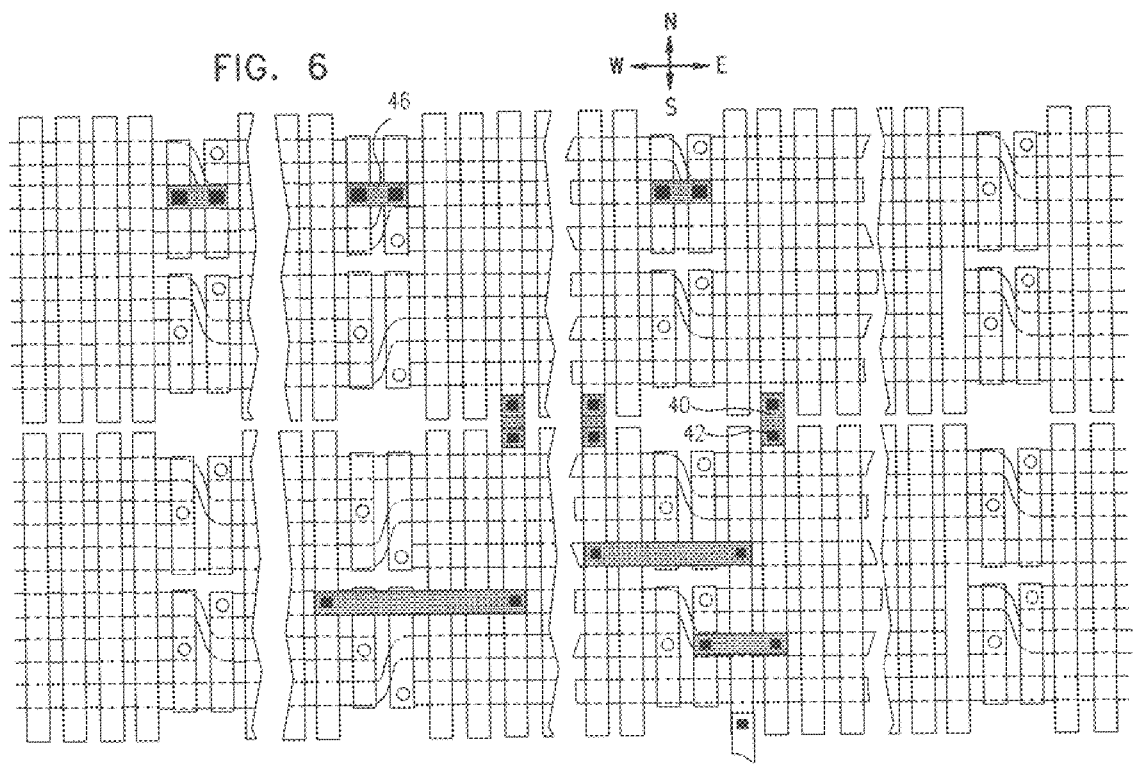
FIG. 6 is a schematic illustration corresponding to FIG. 5 following customization thereof in accordance with a preferred embodiment of the present invention.

Reference is now made to FIG. 5, which is a schematic illustration corresponding to FIGS. 1 & 3 but showing a variation in the arrangement of the lowest of the three metal layers. This variation is provided principally to help overcome problems of signal crosstalk between signals traveling alongside each other along strips 22 over a relatively long distance. In the arrangement of FIG. 5, each strip 44, corresponding to strip 22 (FIGS. 1 & 3) shifts its elongate axis at least one location therealong. As seen in FIG. 6, customization of the embodiment of FIG. 5 may include bridges 46 between adjacent strips 16 of a pair 14, which provide a continuation of East-West routing and also produce a switch between the longitudinal axes of two adjacent strips 44, thus decreasing crosstalk. This is accomplished by limiting the distance that signals travel alongside each other by means of switching and mixing the order of the long routing conductors.

It is appreciated that although the shift is shown embodied in the M5 metal layer, it may be carried out using appropriate vias and an underlying metal layer.

Reference is now made to FIG. 7, which is a schematic illustration corresponding to FIGS. 1 & 3 but showing a variation in the arrangement of the middle of the top three metal layers. This arrangement is provided in order to take into account often oversize strips in M7 layers which, due to their size, could not be placed side by side to provide bridges for adjacent strips 12 without creating a short circuit therebetween.

Figure 8:
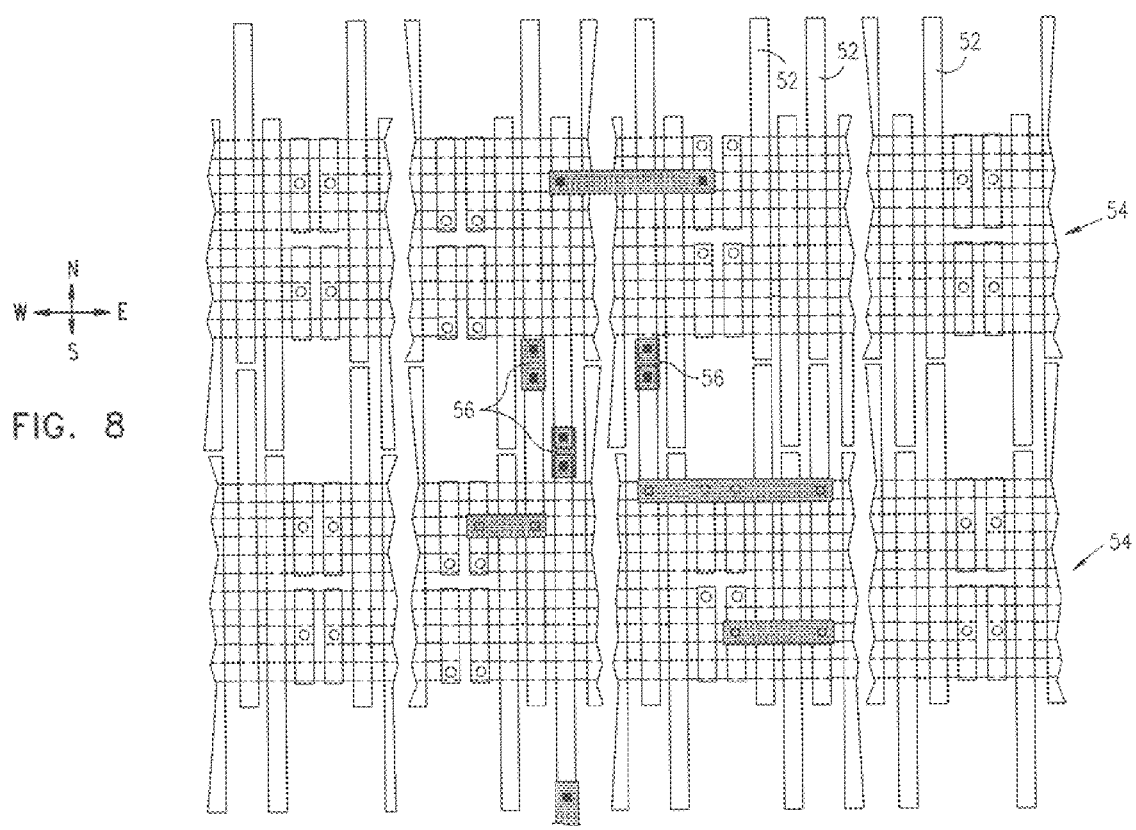
FIG. 8 is a schematic illustration corresponding to FIG. 7 following customization thereof in accordance with a preferred embodiment of the present invention.

The arrangement of FIG. 7 is distinguished from that of FIGS. 1 & 3 in that whereas in FIG. 1 & 3, strips 12 of each band 10 all terminate in a line, defining an elongate edge of band 10, which is spaced from the corresponding elongate edge of an adjacent band 10, in FIG. 7, the strips 52 of adjacent bands 54 do not terminate at the same North-South location. Thus, in the embodiment of FIG. 7, the strips of adjacent bands 54 are interlaced. As seen in FIG. 8, bridges 56 between strips 52 of adjacent bands 54 are thus offset from each other, providing ample spacing therebetween notwithstanding the relatively large width of the bridges.

Figure 9:
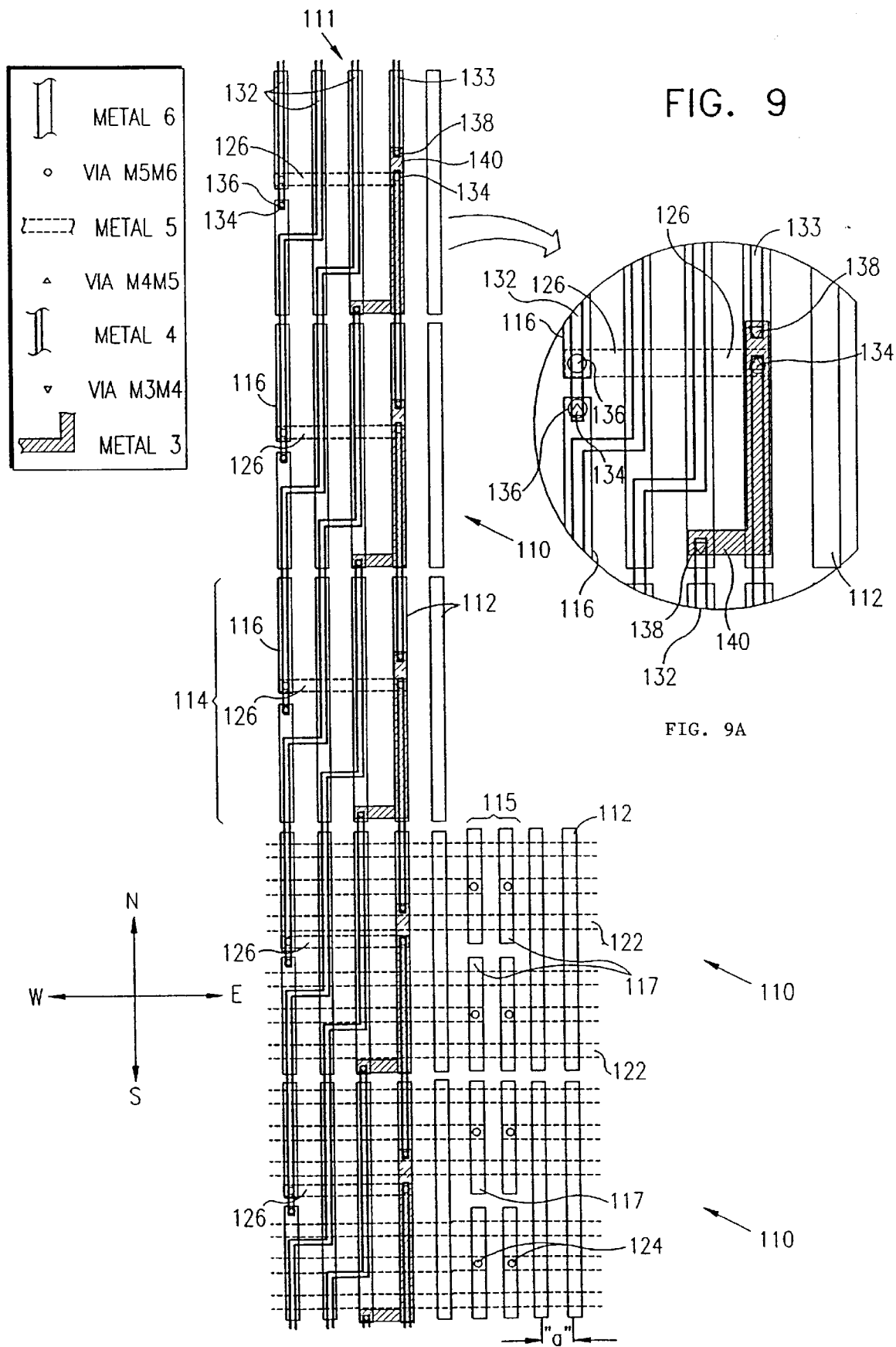

Reference is now made to FIGS. 9 and 9A, which show a schematic illustration of the lower four of the top five metal layers of a gate array device constructed and operative in accordance with another preferred embodiment of the present invention, prior to customization.

In accordance with a preferred embodiment of the invention, the gate array device of FIGS. 9 and 9A, when customized, includes a total of seven metal layers, identified as M1–M7, the top metal layer being identified as M7. In FIGS. 9 and 9A, the top metal layer M7 is not shown, inasmuch as this metal layer is added during customization, as will be described hereinbelow with reference to FIGS. 10 and 10A.

The basic structure shown in FIGS. 9 and 9A comprises a M6 metal layer which comprises multiple spaced bands 110 of parallel evenly spaced metal strips 112, the center lines of which are preferably separated one from the other by a distance "a". Pair 114 provides connections to long routing conductors in North-South directions, which are implemented by M4 strips 132 and 133 as described hereinbelow.

Underlying the M6 metal layer typically is an M5 metal layer comprising parallel evenly spaced metal strips 122 extending East-West in the sense of FIGS. 9 and 9A in bands 110. In the illustrated embodiment of FIGS. 9 and 9A, strips 122 each extend across three pairs 115 of short strips 117 and are each connected at opposite ends thereof by means of an M5M6 via 124 to a strip 117. Pair 115 provides connections to long routing conductors in East-West directions.

It is noted that adjacent ones of strips 122 begin and end at strips 117 of different pairs 115, such that each pair 115 of strips 117 is connected to strips 122 extending along a different axis. It is appreciated that each strip 117 preferably is connected to only a single strip 122. The portion of the pattern which provides long routing conductors in East-West directions along M5 strips 122 is described hereinabove with reference to FIGS. 1 & 3. The M5 layer also comprises a plurality of bridge elements 126 which extend parallel to strips 122.

Underlying the M5 metal layer there is provided an M4 metal layer preferably comprising evenly spaced stepped strips 132 and straight strips 133, extending generally North-South in the sense of FIGS. 9 and 9A across multiple bands 110. At a given periodicity, typically every four to seven strips 112, a plurality of pairs 114 of coaxial short strips 116 is provided.

FIGS. 9 and 9A show a single band 111 of parallel stepped strips 132 and straight strips 133. Multiple similar bands 111 extending in the North-South directions are provided in a semi-conductor device. Strips 112 and 116 are shown running North-South. The Southmost end of each strip 132 is connected by an M4M5 via 134 and an M5M6 via 136 to a Northmost end of a strip 116 of a pair 114. A facing end of a second strip 116 of pair 114 is connected by an M5M6 via 136 to an Westmost end of a bridge element 126, the Eastmost end of which is connected by an M4M5 via 134 to a Northmost end of a strip 133.

The Southmost end of a strip 133 is connected by an M3M4 via 138 to the Northmost end of an L-shaped tunnel 140 embodied in an M3 metal layer. The South-Westmost end of tunnel 140 is connected by an M3M4 via 138 to the Northmost end of a strip 132.

Figure 10:
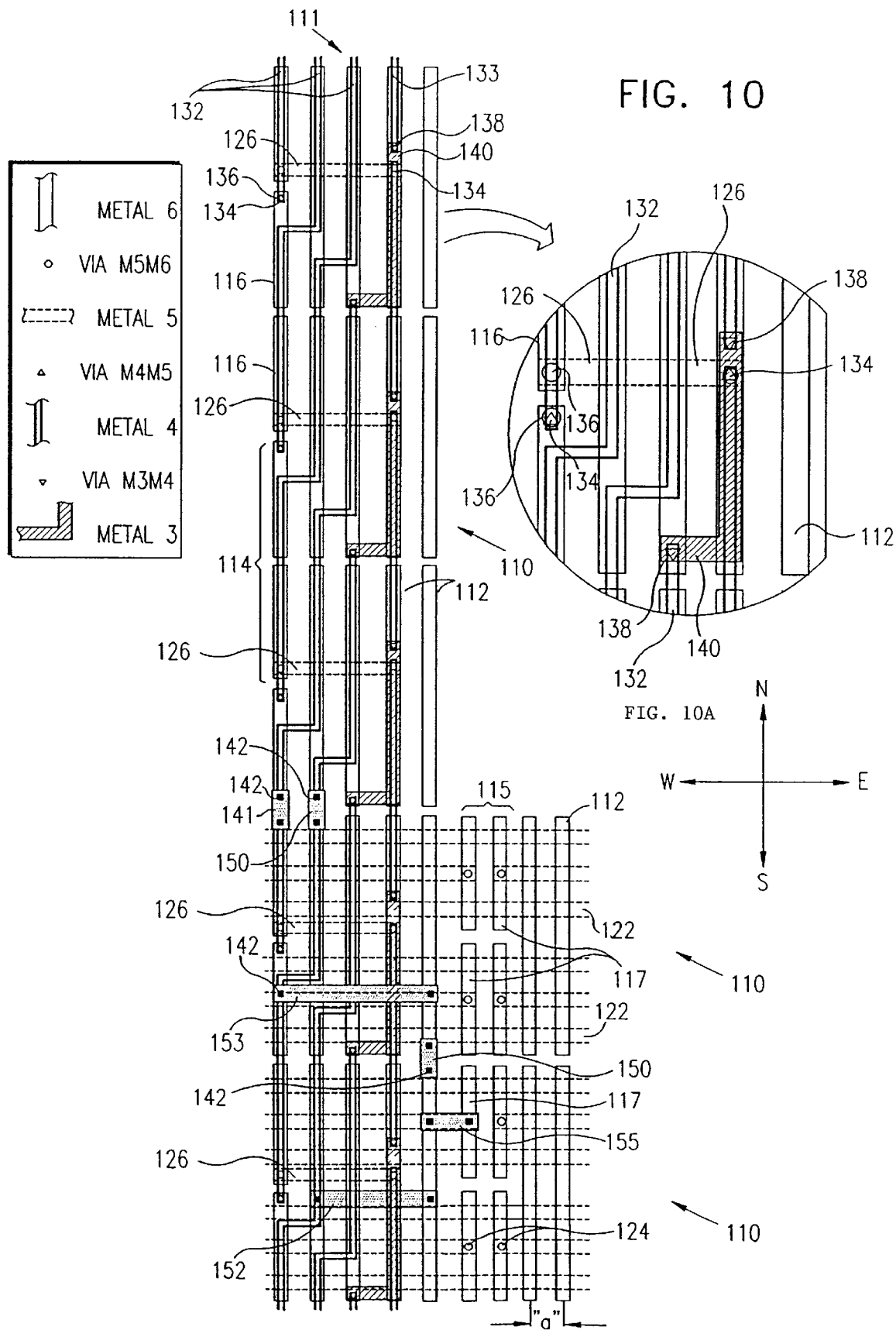

Reference is now made to FIGS. 10 and 10A, which is a schematic illustration corresponding to FIGS. 9 and 9A following customization thereof. It is seen that in FIGS. 10 and 10A an M7 layer is added for customization of the gate array. The M7 layer may include a bridge 141 connected by M6M7 vias 142 to adjacent strips 116 of a pair 114, thus effectively connecting two strips 132.

The M7 layer may also provide another type of connection, such as connections 153 between one of strips 116 and a strip 112, by means of M6M7 vias 142. This type of connection provides a circuit connection between a strip 132 and a strip 112 employing short strip 116, thereby to route signals over a relatively long distance in North-South directions. It is appreciated that the arrangement of FIGS. 10 and 10A enables all connections to North-South M4 strips 132 and 133 to be made generally along one North-South axis 114.

The M7 layer may also provide a further type of connection, such as connections 150 between strips 112 in two adjacent bands 110, by means of M6M7 vias 142. This type of connection provides a North-South circuit connection by means of strips 112. Connections 152 between strips 112 in the same band and a connection 155 between strip 117 and strips 112 in the same band may also be provided. It is thus appreciated that the customized structure of FIGS. 10 and 10A enables a signal received along a strip 122 to be conveyed in an East-West direction via strips 122 and to be coupled to a strip 132 at an appropriate East-West location by properly employing the M7 layer and the M6M7 vias 142 using M6 strips 112, 116 and 117. FIGS. 10 and 10A show such a structure employing M7 connections 150, 153 and 155.

Figures 11, 11A, 11B:
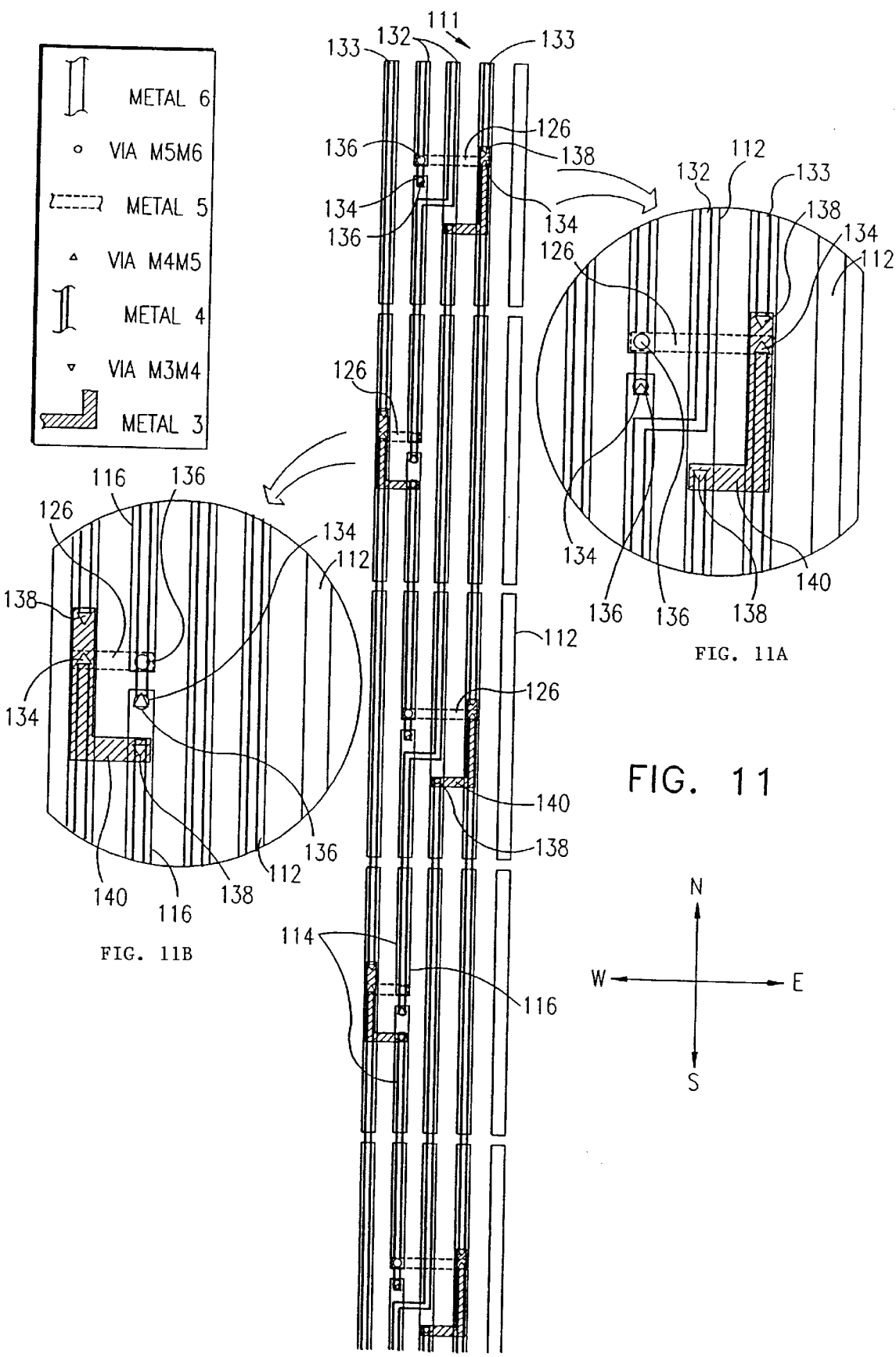
FIGS. 11, 11A, and 11B schematically the lower four of the top five metal layers of a gate array device constructed and operative in accordance with yet another preferred embodiment of the present invention, prior to customization.

Reference is now made to FIGS. 11, 11A, and 11B which show a schematic illustration corresponding to FIGS. 9 and 9A but showing a variation in the arrangement of the M3, M4 and M5 metal layers. This variation is provided principally to help overcome problems of signal crosstalk between signals traveling alongside each other along strips 132 over a relatively long distance. In the arrangement of FIGS. 11, 11A and 11B, there is provided in the M4 metal layer an arrangement which enables shifting of the elongate axis of North-South extending conductors in both East and West directions, thus enabling crosstalk to be decreased by appropriate switching of the order of strips 132. This is accomplished by limiting the distance that signals travel alongside each other by means of switching and mixing the order of the long routing conductors.

FIGS. 12, 12A, and 12B show the configuration of FIGS. 11, 11A, and 11B following exemplary customization by the addition of a via M6M7 and M7 layers.

Reference is now made to FIG. 13, which is a schematic illustration corresponding to FIGS. 1 & 3 with additional bridges 160 in the M6 layer extending perpendicular to metal strips 161, which correspond to strips 12 in the embodiment of FIGS. 1 & 3.

FIG. 13 together with FIGS. 14 and 15, which is referred to hereinbelow, illustrate another preferred embodiment of the present invention wherein customization is effected only in M6M7 vias. This embodiment provides savings in customization tooling by keeping the M7 metal layer fixed.

Figure 14:
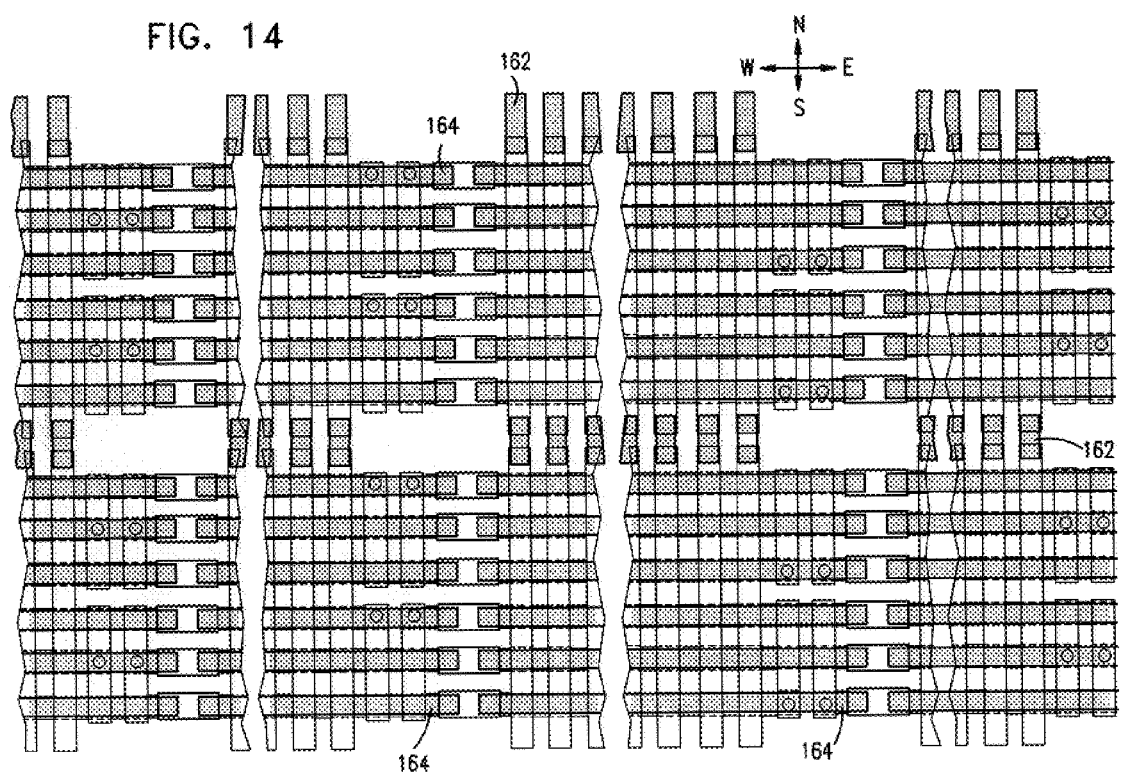
FIG. 14 is a schematic illustration corresponding to FIG. 13 and showing the top metal layer, prior to customization; 15 is a schematic illustration corresponding to FIG. 14 having via customization in accordance with a preferred embodiment of the present invention.

FIG. 14 is a schematic illustration corresponding to FIG. 13 and showing the top metal layer M7, prior to customization. As seen in FIG. 14, the M7 layer includes bridges 162 extending North-South and relatively long strips 164 extending East-West. Strips 164 partially overlie bridges 160 and bridges 162 partially overlie strips 161.

Figure 15:
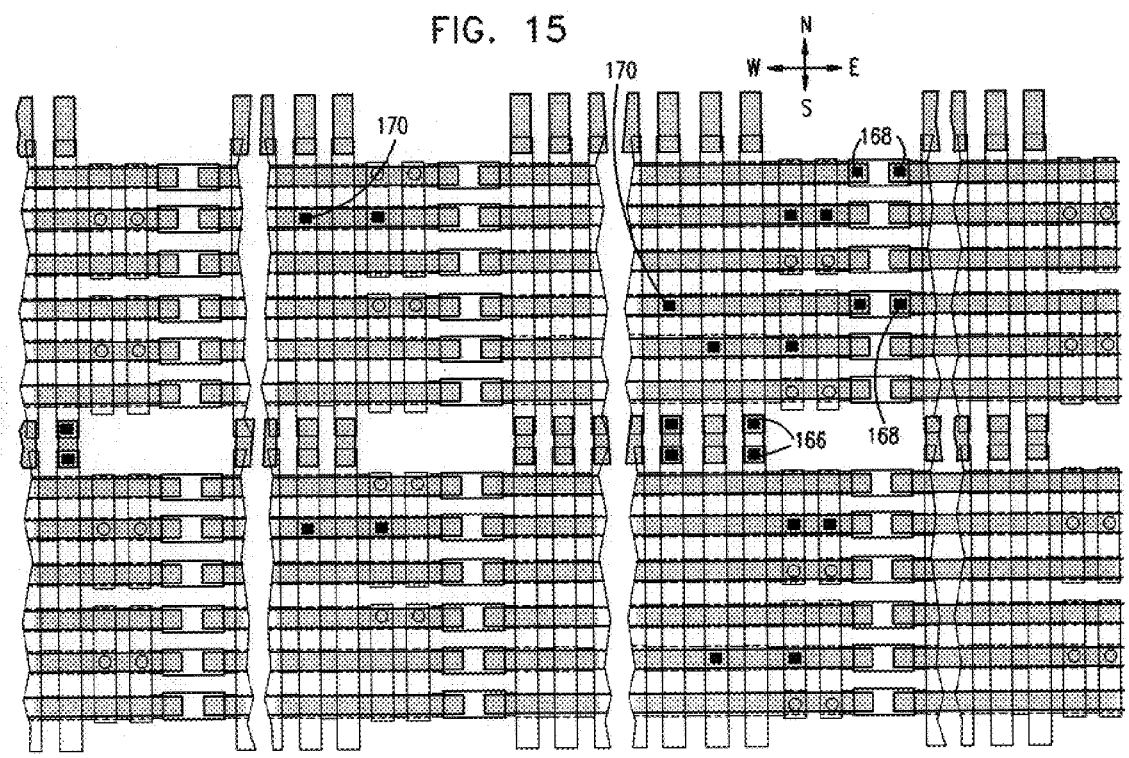

FIG. 15 is a schematic illustration corresponding to FIG. 14 having via customization. It is seen that M6M7 vias 166 interconnect strips 161 by employing bridges 162 in order to provide North-South routing. Other M6M7 vias 168 interconnect strips 164 by employing bridges 160 in order to provide East-West routing. Additional M6M7 vias 170 interconnect strips 161 with strips 164 in order to interconnect the East-West routing with the North-South routing.

The following drawings, FIGS. 16 to 22, show typical designs of the various layers constructed and operative in accordance with a preferred embodiment of the present invention.

Figure 16:
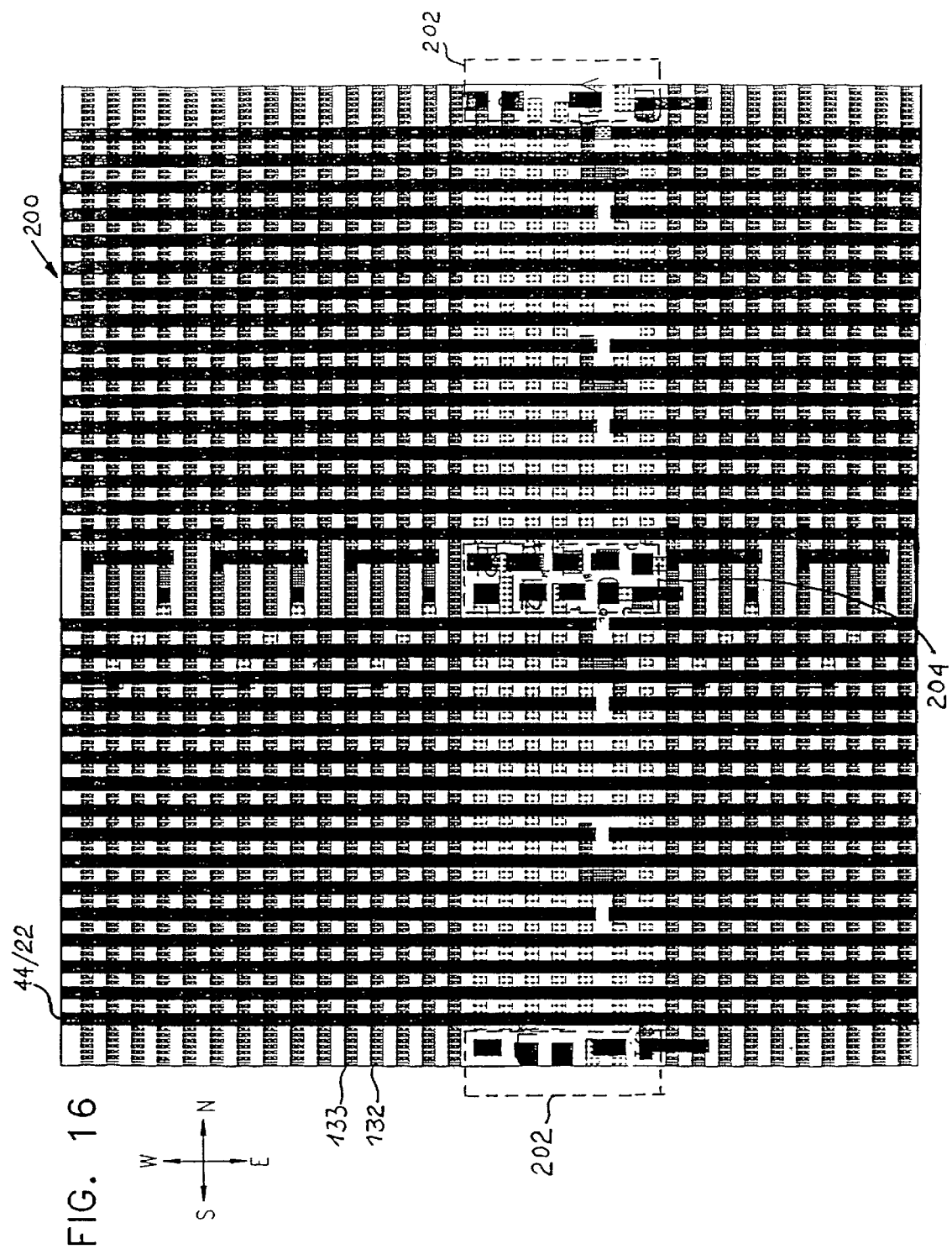
FIG. 16 illustrates a single cell routing unit, comprising layers M4 to M6 and I/O contacts in accordance with a preferred embodiment of the present invention.
Figure 17:
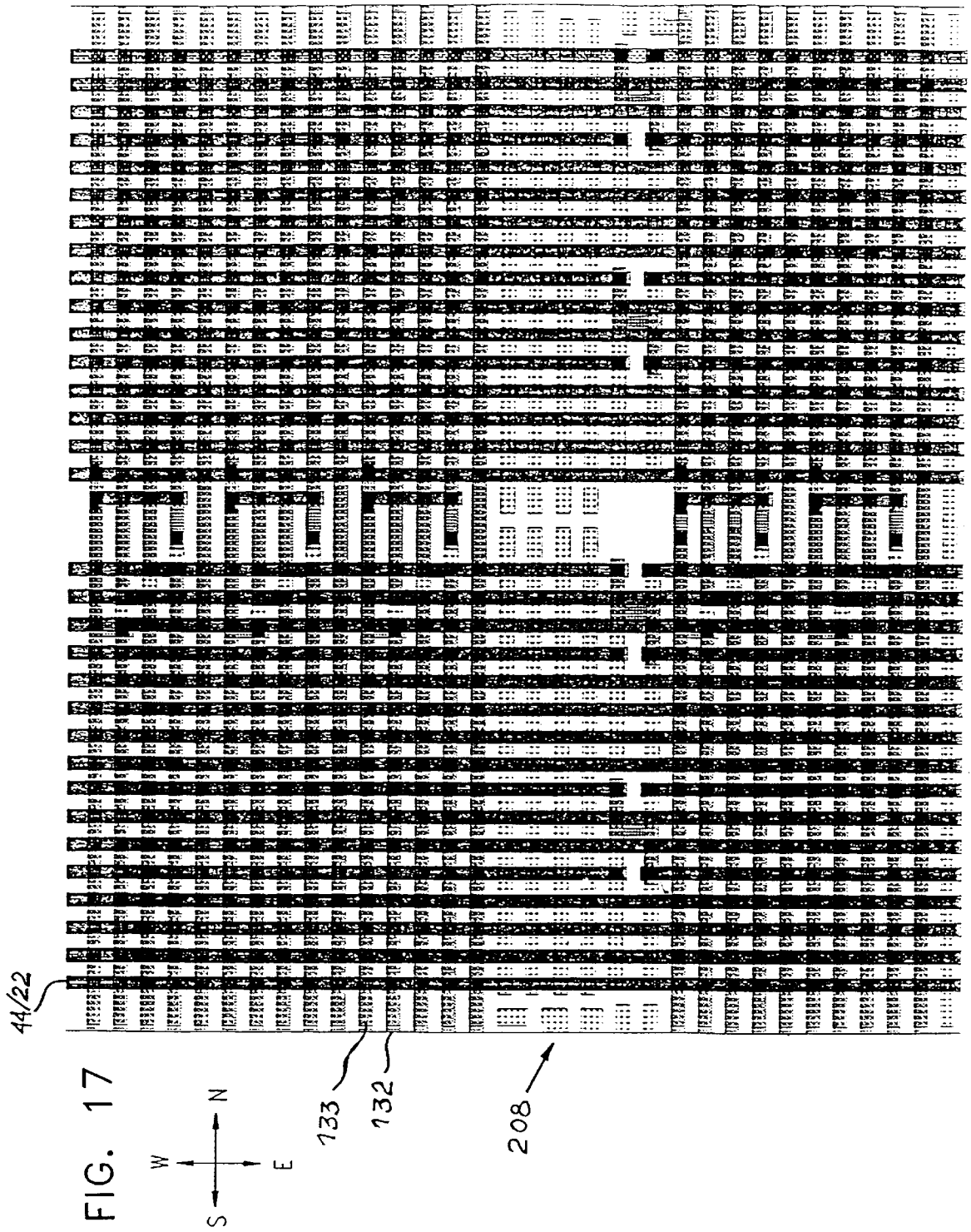
FIG. 17 illustrates a single cell unit of similar construction to the single cell routing unit of FIG. 16, but without the I/O contacts.

Reference is now made to FIG. 16, which illustrates a single cell unit 200, comprising layers M4 to M6, constructed and operative in accordance with a preferred embodiment of the present invention. The cell unit 200, illustrated in FIG. 16, comprises 3 I/O contacts 202, 204 and 206 to a logic cell (not shown) at layer M3. The cell unit 200 in FIG. 16 also shows strips 44/22, typically located in an E-W direction, and corresponding to the strips 44/22 shown in FIGS. 3 and 5. The cell unit 200 shows the strips 44/22 overlap the N-S strips 132 and 133, as described hereinabove with respect to FIGS. 9 and 11. FIG. 17 shows a cell unit 208, of similar construction to cell unit 200 of FIG. 16, but without the I/O contacts 202, 204 and 206.

Figure 18:
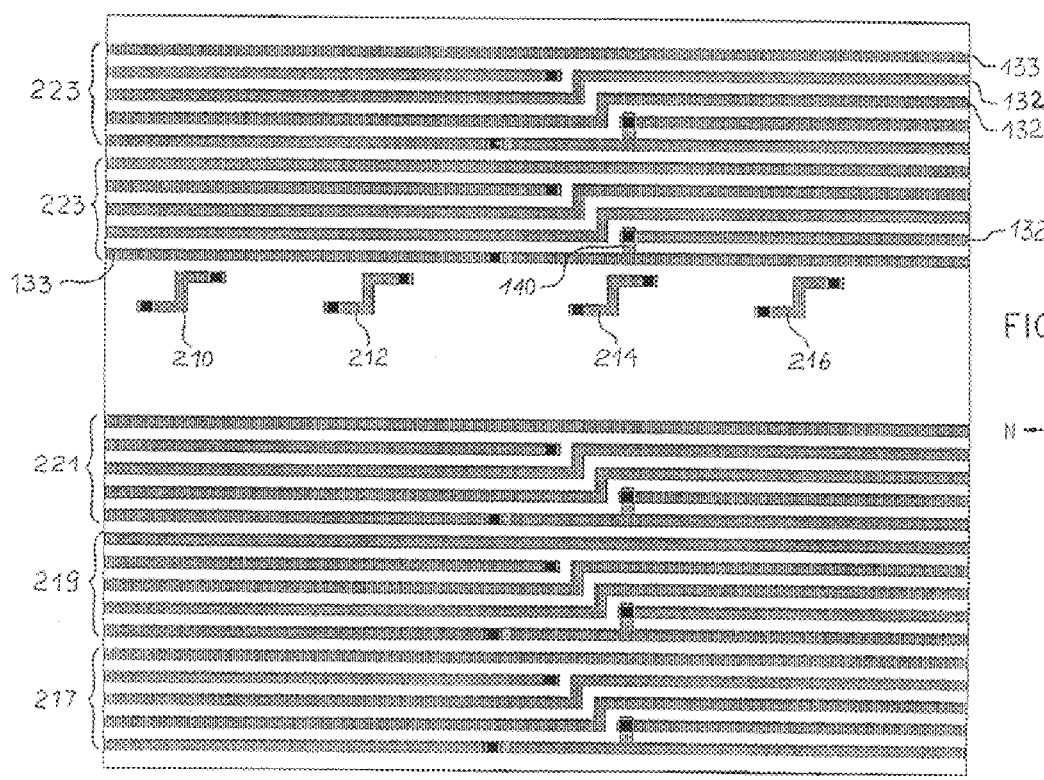
FIG. 18 illustrates typical routing connections in the M3 and M4 layers, and the M3M4 via and M4M5 via layers, of the single cell routing unit, in accordance with a preferred embodiment of the present invention.

Reference is now made to FIG. 18, which illustrates typical routing connections in the M3 and M4 layers, and the M3M4 via and M4M5 via layers, of the cell unit 200. The routing connections shown in FIG. 18, correspond to the straight strips 133 and the stepped strips 132 shown in FIGS. 9 and 11. FIG. 18 also shows the L-shaped tunnel 140, embodied in the M3 layer, connecting the Southmost end of strip 133 to the Northmost end of strip 132. FIG. 18 further illustrates a series of S-shaped contacts 210, 212, 214 and 216, in layer M4, for providing a shift between strips 44 of layer M5 using the M4M5 vias, as described hereinabove with respect to FIG. 5. The contacts 210, 212, 214 and 216, help to reduce the crosstalk between parallel strips, as discussed hereinabove with reference to FIG. 5. FIG. 18 also shows multiple bands 217, 219, 221, 223 and 225, which run in the North-South direction, corresponding to the band 111 of FIG. 9.

Figure 19:
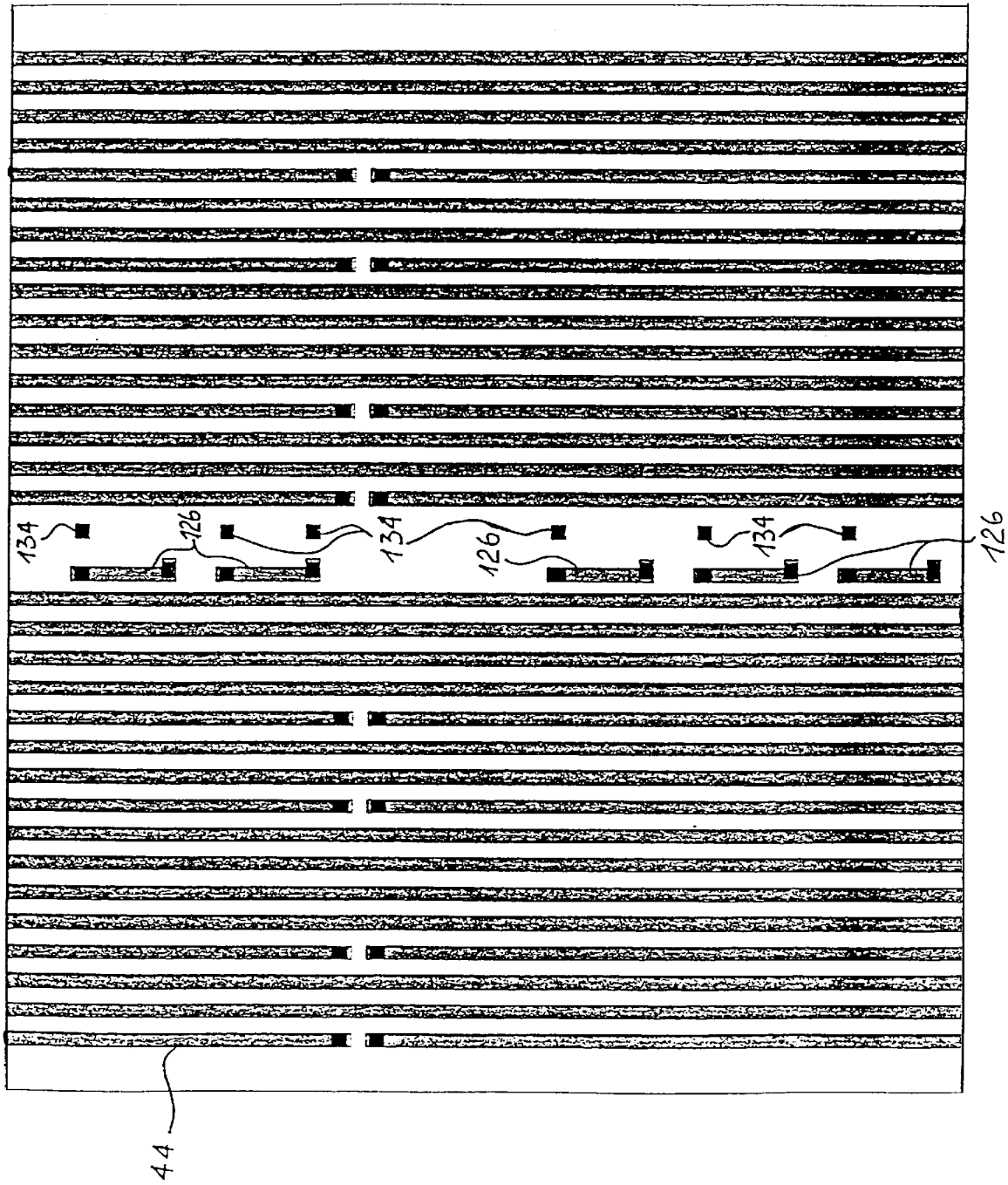
FIG. 19 illustrates an M5 layer corresponding to the arrangement described hereinabove with respect to FIG. 5.

Reference is now made to FIG. 19, which illustrates an M5 layer corresponding to the arrangement described hereinabove with respect to FIG. 5. The strips 44 in the E-W direction, shown in FIG. 19, correspond to the strips 44 of FIG. 5. FIG. 19 also shows bridging elements 126 between strips 116 and 133 of FIGS. 9 and 11, and a series of M4M5 vias 134.

Figure 20:
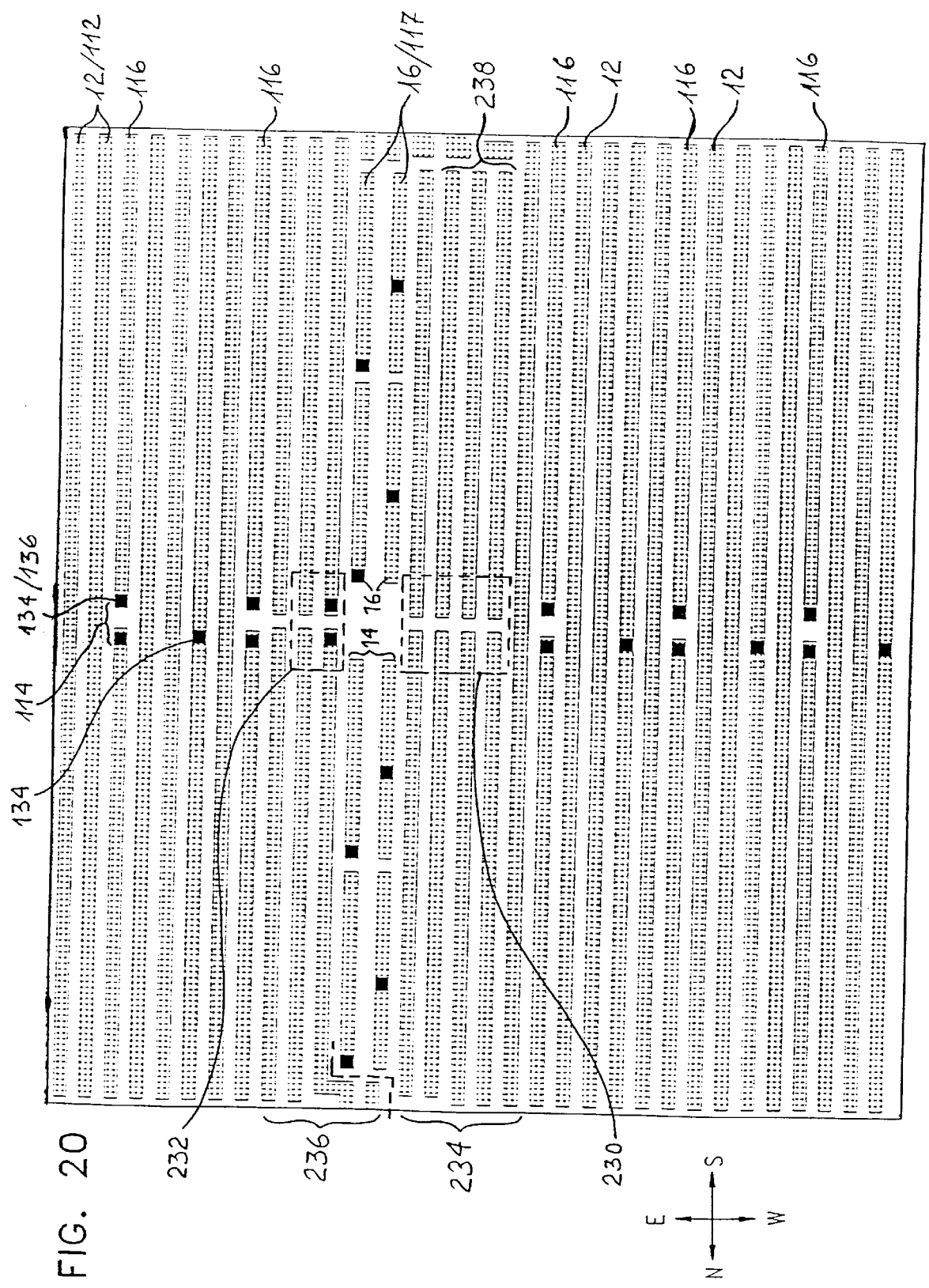
FIG. 20 illustrates an M6 layer with vias M5M6 corresponding to the M6 layers of FIG. 9.

Reference is now made to FIG. 20, which shows the M6 layer with vias M5M6, corresponding to the M6 layers of FIG. 9. Additionally, FIG. 20 shows the strips 16/117 and 12/112 corresponding to the strips in FIGS. 1 and 9, and strip 116 corresponding to the strips in FIG. 9. FIG. 20 also shows typical I/O connections 230, 232, 234, 236 and 238.

Figure 21:
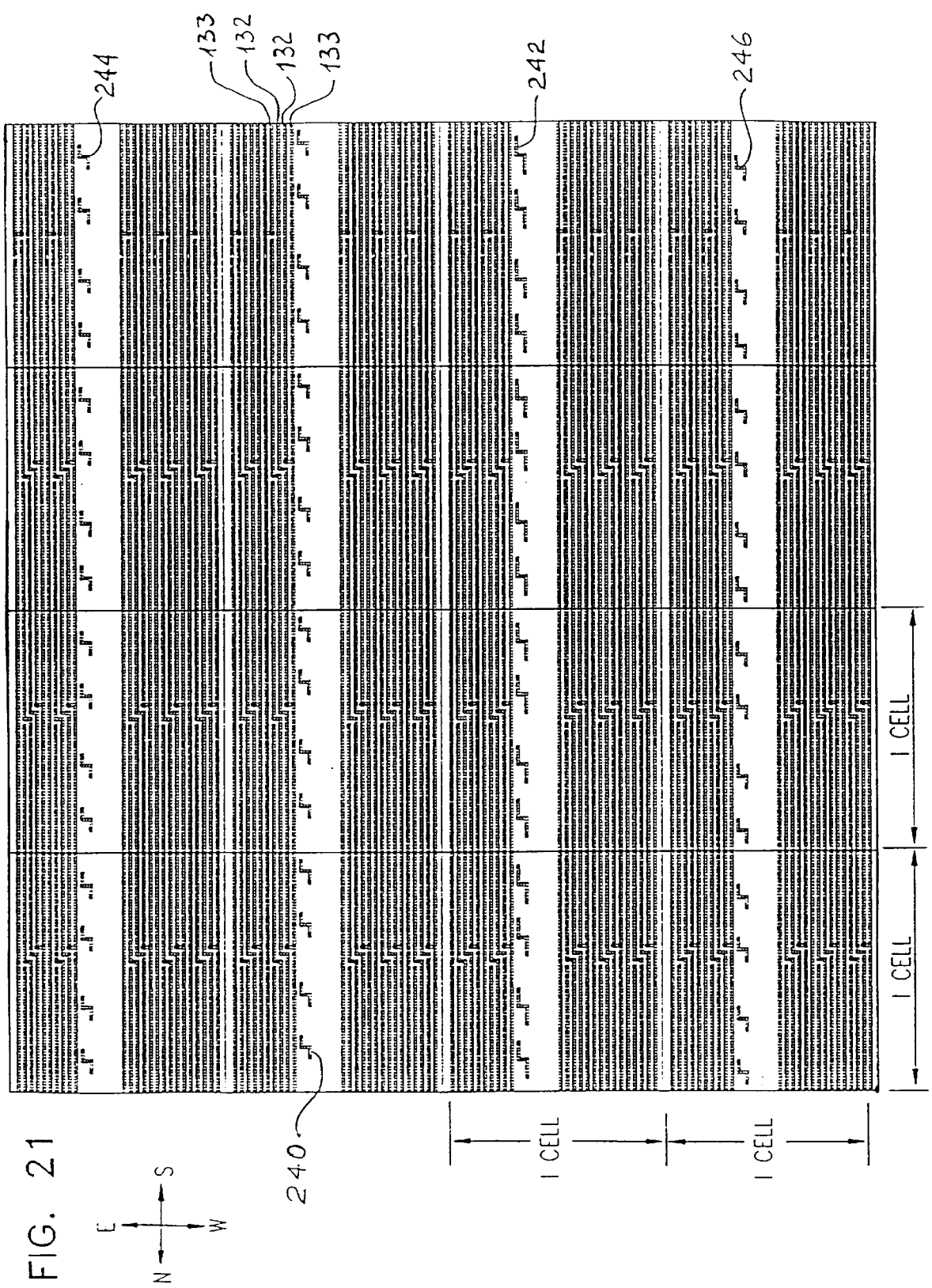
FIG. 21 illustrates a typical arrangement of 16 cells of M3 and M4 layers in a 4×4 matrix, in accordance with a preferred embodiment of the present invention.

Reference is now made to FIG. 21, and shows a typical arrangement of 16 cells 200 of M3 and M4 layers, and the M3M4 via and M4M5 via layers, in a 4×4 matrix, in accordance with a preferred embodiment of the present invention. FIG. 21 also shows the strips 132 and 133, corresponding to strips 132 and 133 of FIGS. 9 and 11. FIG. 21 further illustrates a series of S-shaped contacts 240, 242, 244, 246 in layer M4, as described hereinabove with respect to FIG. 18, for providing a shift between strip 44 of layer M5 using the M4M5 vias, as described hereinabove with respect to FIG. 5.

Figure 22:
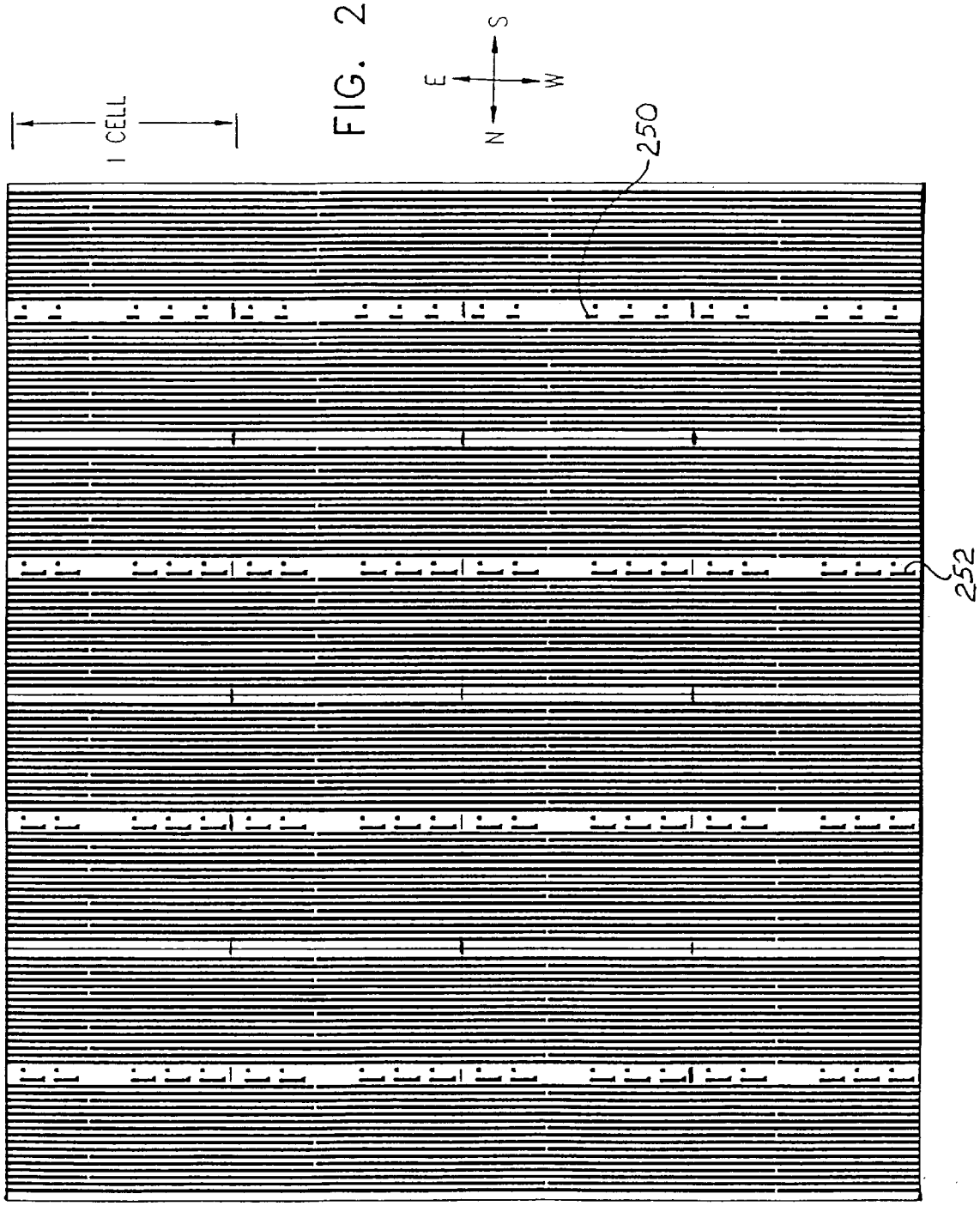
FIG. 22 illustrates an M5 layer comprising a 4×4 matrix of 16 cells, in accordance with a preferred embodiment of the present invention.

Reference is now made to FIG. 22, which illustrates an M5 layer comprising a 4×4 matrix of 16 cells 200, in accordance with a preferred embodiment of the present invention. The M5 layer comprises strips 44/22, as shown in FIGS. 3 and 5, and also shows typical bridges 250 and 252, corresponding to the bridge 126 of FIG. 11. The bridge 250 is in the East direction and the bridge 252 is in the West direction.

Reference is now made to FIG. 23, which illustrates an M6 layer and M5M6 via layer of a 4×4 cell 200 matrix, in accordance with a preferred embodiment of the present invention. The M6 layer typically comprises multiple spaced bands 260, 262, 264 and 266, which run in the East-West direction. The multiple cells 260 to 266 correspond to the multiple spaced bands 10 of FIG. 1, and to the E-W bands 110 of FIG. 9.

Reference is now made to FIG. 24, which illustrates the layers M3, M4, M5, M6 and M7 in a 4×4 cell matrix, in accordance with a preferred embodiment of the present invention.

It will be appreciated by persons skilled in the art that the present invention is not limited by what has been particularly shown and described hereinabove. Rather the scope of the present invention includes both combinations and sub-combinations of the various features described hereinabove as well as modifications and variations thereof which would occur to persons skilled in the art upon reading the foregoing description and which are not in the prior art.

What is claimed is:

1. A semiconductor device comprising:
   a substrate;
   at least first, second and third metal layers formed over said substrate, said second metal layer comprising a plurality of generally parallel bands extending parallel to a first axis, each band comprising a multiplicity of second metal layer strips extending perpendicular to said first axis; and at least one via connecting at least one second metal layer strip with said first metal layer underlying said second metal layer; and wherein said third metal layer comprises at least one third metal layer strip extending generally perpendicular to said second metal layer strips and being connected thereto by a via.

2. A semiconductor device comprising:

a substrate;

at least first, second and third metal layers formed over said substrate, said second metal layer comprising a plurality of generally parallel bands extending parallel to a first axis, each band comprising a multiplicity of second metal layer strips extending perpendicular to said first axis; and at least one via connecting at least one second metal layer strip with said first metal layer underlying said second metal layer; and wherein said third metal layer comprises at least one third metal layer strip extending generally parallel to said second metal layer strips and connecting two coaxial second metal layer strips by vias.

3. A semiconductor device comprising:

a substrate;

at least first, second and third metal layers formed over said substrate, said second metal layer comprising a plurality of generally parallel bands extending parallel to a first axis, each band comprising a multiplicity of second metal layer strips extending perpendicular to said first axis; and at least one via connecting at least one second metal layer strip with said first metal layer underlying said second metal layer; and wherein said first metal layer underlying said second metal layer comprises a multiplicity of first metal layer strips extending generally parallel to said multiplicity of second metal layer strips.

4. A semiconductor device according to claim 3 and wherein at least one of said first metal layer strips is electrically connected at ends thereof to different second metal layer strips for providing electrical connection therebetween.

5. A semiconductor device according to claim 4 and wherein said third metal layer comprises at least one third metal layer strip extending perpendicular to said second metal layer strips and being connected thereto by a via.

6. A semiconductor device according to claim 4 and wherein said third metal layer comprises at least one third metal layer strip extending parallel to said second metal layer strips and connecting two coaxial second metal layer strips by vias.

7. A semiconductor device comprising:

a substrate;

at least first, second and third metal layers formed over said substrate, said second metal layer comprising a plurality of generally parallel bands extending parallel to a first axis, each band comprising a multiplicity of second metal layer strips extending perpendicular to said first axis; and at least one via connecting at least one second metal layer strip with said first metal layer underlying said second metal layer; and wherein:

said first metal layer comprises at least one first metal layer strip extending generally perpendicular to said second metal layer strips and being connected thereto by a via; and said third metal layer comprises at least one third metal layer strip extending perpendicular to said second metal layer strips and being connected thereto by a via.

8. A semiconductor device comprising:

a substrate;

at least first, second and third metal layers formed over said substrate, said second metal layer comprising a plurality of generally parallel bands extending parallel to a first axis, each band comprising a multiplicity of second metal layer strips extending perpendicular to said first axis; and at least one via connecting at least one second metal layer strip with said first metal layer underlying said second metal layer, and wherein:

said first metal layer comprises at least one first metal layer strip extending generally perpendicular to said second metal layer strips and being connected thereto by a via; and said third metal layer comprises at least one third metal layer strip extending parallel to said second metal layer strips and connecting two coaxial second metal layer strips by vias.

9. A semiconductor device comprising:

a substrate;

at least first, second and third metal layers formed over said substrate, said second metal layer comprising a plurality of generally parallel bands extending parallel to a first axis, each band comprising a multiplicity of second metal layer strips extending perpendicular to said first axis; and at least one via connecting at least one second metal layer strip with said first metal layer underlying said second metal layer; and wherein:

said second metal layer strips include both long strips and short strips, where said short strips are shorter than said long strips, at least one of said short strips being connected to said first metal layer by a via;

said short second metal layer strips are arranged in side by side arrangement; and said third metal layer comprises a bridge connecting adjacent pairs of said short second metal layer strips.

10. A semiconductor device according to claim 1 and also comprising at least one third metal layer strip extending parallel to said second metal layer strip and connecting two coaxial second metal layer strips.

11. A semiconductor device comprising:

a substrate;

at least first, second and third metal layers formed over said substrate, said second metal layer comprising a multiplicity of second metal layer strips extending perpendicular to a first axis, adjacent ones of said second metal layer strips having ends which do not lie in a single line;

and wherein:

said second metal layer strips are interlaced with one another; and said third metal layer comprises at least one third metal layer strip extending generally perpendicular to said second metal layer strip and being connected thereto by a via.

12. A semiconductor device comprising:

a substrate;

at least first, second and third metal layers formed over said substrate, said second metal layer comprising a multiplicity of second metal layer strips extending perpendicular to said first axis, adjacent ones of said second metal layer strips having ends which do not lie in a single line;

and wherein:

said second metal layer strips are interlaced with one another; and said third metal layer comprises at least one third metal layer strip extending generally parallel to said second metal layer strips and connecting two coaxial second metal layer strips by vias.

13. A semiconductor device comprising:

a substrate;

at least first, second and third metal layers formed over said substrate, said second metal layer comprising a plurality of generally parallel bands extending parallel to a first axis, each band comprising a multiplicity of second metal layer strips extending perpendicular to said first axis; and a plurality of mutually parallel short second metal layer strips extending generally parallel to said first axis, said short second metal layer strips being shorter than the full dimension of the semiconductor device in the direction perpendicular to the first axis; and wherein said third metal layer comprises at least one third metal layer strip extending generally perpendicular to said second metal layer strips and being connected thereto by a via.

14. A semiconductor device according to claim 13 and wherein at least one of said third metal strips connects two second metal layer strips by means of vias.

15. A semiconductor device comprising:

a substrate;

at least first, second and third metal layers formed over said substrate, said second metal layer comprising a plurality of generally parallel bands extending parallel to a first axis, each band comprising a multiplicity of second metal layer strips extending perpendicular to said first axis; and a plurality of mutually parallel short second metal layer strips extending generally parallel to said first axis, said short second metal layer strips being shorter than the second metal layer strips; and wherein said third metal layer comprises at least one third metal layer strip extending generally parallel to said second metal layer strips and connecting two coaxial second metal layer strips by vias.

16. A semiconductor device according to claim 15 and wherein at least one of said third metal strips connects two second metal layer strips by means of vias.

17. A semiconductor device comprising:

a substrate;

at least first, second, third and fourth metal layers formed over said substrate, said second metal layer comprising a plurality of generally parallel bands extending parallel to a first axis, each band comprising a multiplicity of long strips extending parallel to said first axis, said long strips including at least one of straight strips and stepped strips;

at least one electrical connection between at least one strip in said second metal layer to said third metal layer, which overlies said second metal layer.

18. A semiconductor device according to claim 17 and wherein said second metal layer comprises a repeating pattern.

19. A semiconductor device according to claim 18 and wherein said strips of said second metal layer are connected to one of said third metal layer and said fourth metal layer, both of which overlie said second metal layer, by at least two electrical connections.

20. A semiconductor device according to claim 18 and wherein most of said strips of said second metal layer are connected to one of said third metal layer and said fourth metal layer, both of which overlie said second metal layer, by at least two electrical connections.

21. A semiconductor device according to claim 20 and wherein at least one of said strips of said second metal layer is electrically connected to another one of said strips of said second metal layer which is non-adjacent thereto.

22. A semiconductor device according to claim 18 at and wherein said semiconductor device forms part of a larger semiconductor device.

23. A semiconductor device according to claim 18 and wherein said first metal layer comprises a plurality of generally parallel bands extending parallel to a first axis, each band comprising a multiplicity of long strips extending parallel to said first axis, said long strips including at least one of straight strips and stepped strips;

at least one electrical connection between at least one strip in said first metal layer to said third metal layer, which overlies said first metal layer.

24. A semiconductor device according to claim 23 and wherein said first metal layer comprises a repeating pattern.

25. A semiconductor device according to claim 23 and wherein said strips of said first metal layer are connected to one of said third metal layer and said fourth metal layer, both of which overlie said first metal layer, by at least two electrical connections.

26. A semiconductor device according to claim 23 and wherein most of said strips of said first metal layer are connected to one of said third metal layer and said fourth metal layer, both of which overlie said first metal layer, by at least two electrical connections.

27. A semiconductor device according to claim 23 and wherein at least one of said strips of said first metal layer is electrically connected to another one of said strips of said first metal layer which is non-adjacent thereto.

28. A semiconductor device according to claim 23 and wherein said semiconductor device forms part of a larger semiconductor device.

* * * * *